US012796109B2

(12) United States Patent
Thomson et al.

(10) Patent No.: US 12,796,109 B2
(45) Date of Patent: Nov. 10, 2026

(54) DIODES WITH BACKSIDE CONTACT

(71) Applicant: Intel Corporation, Santa Clara, CA (US)

(72) Inventors: Nicholas A. Thomson, Hillsboro, OR (US); Kalyan C. Kolluru, Portland, OR (US); Ayan Kar, Portland, OR (US); Mauro J. Kobrinsky, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 183 days.

(21) Appl. No.: 17/943,812

(22) Filed: Sep. 13, 2022

(65) Prior Publication Data

US 2024/0088131 A1 Mar. 14, 2024

(51) Int. Cl.
*H10D 89/60* (2025.01)
*H10D 8/00* (2025.01)
*H10D 62/10* (2025.01)

(52) U.S. Cl.
CPC ........... *H10D 89/611* (2025.01); *H10D 8/411* (2025.01); *H10D 62/121* (2025.01); *H10D 89/811* (2025.01)

(58) Field of Classification Search
CPC .... H10D 89/611; H10D 8/411; H10D 62/121; H10D 89/811; H10D 8/045; H10D 62/115; H10D 62/117; H10D 30/43–435; H10D 62/119–123; H10D 8/00–825
See application file for complete search history.

(56) References Cited

U.S. PATENT DOCUMENTS

2022/0045052 A1* 2/2022 Huang .................. H10D 30/43
2023/0395681 A1* 12/2023 Liu ...................... H10D 30/014

* cited by examiner

*Primary Examiner* — Shahed Ahmed
(74) *Attorney, Agent, or Firm* — Arcane Law PLLC

(57) ABSTRACT

An integrated circuit structure includes a sub-fin having at least a portion that is doped with a first type of dopant, and a diffusion region doped with a second type of dopant. The diffusion region is in contact with the sub-fin and extends upward from the sub-fin. The first type of dopant is one of a p-type or an n-type dopant, and the second type of dopant is the other of the p-type or the n-type dopant. In an example, a first conductive contact is above and on the diffusion region, and a second conductive contact is in contact with the portion of the sub-fin. In an example, the diffusion region is at least a part of one of an anode or a cathode of a diode, and the portion of the sub-fin is at least a part of the other of the anode or the cathode of the diode.

22 Claims, 32 Drawing Sheets

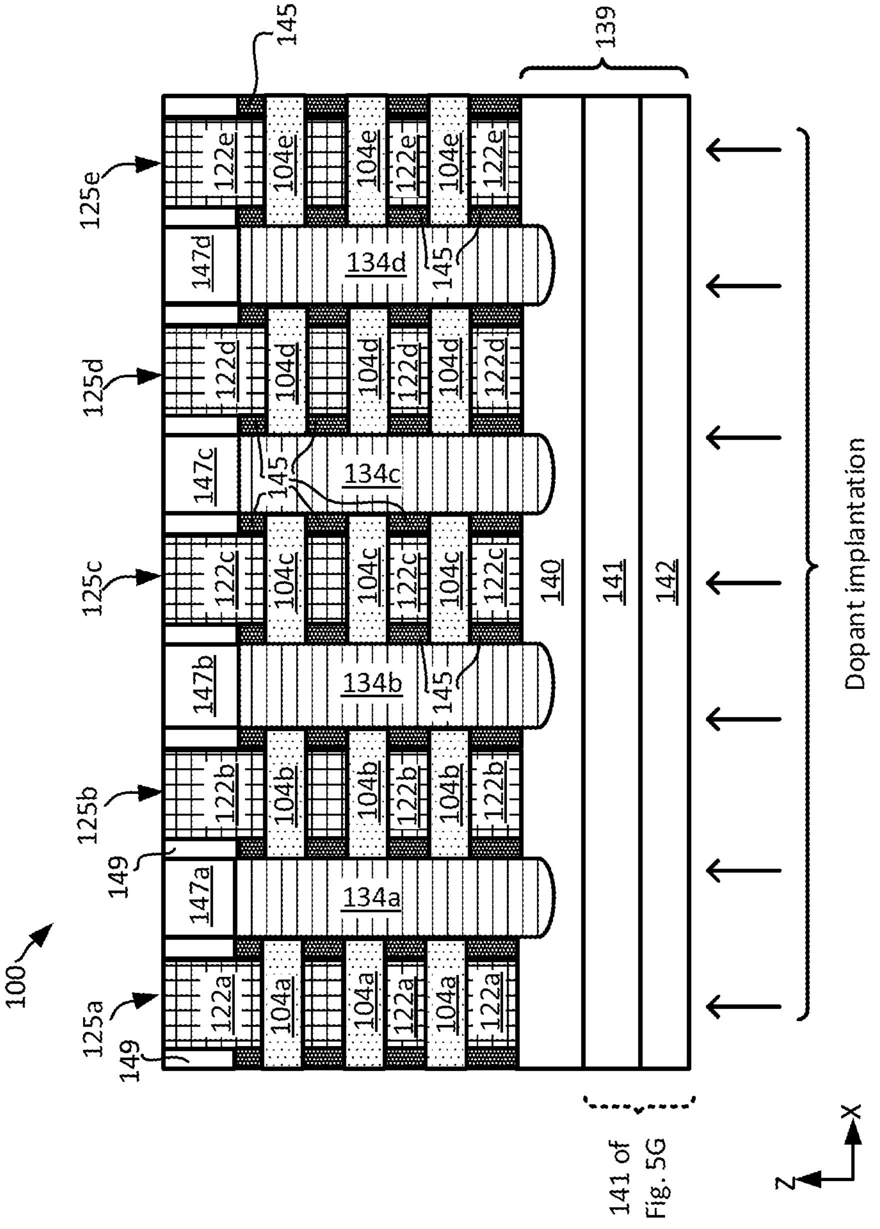
FIG. 5H1

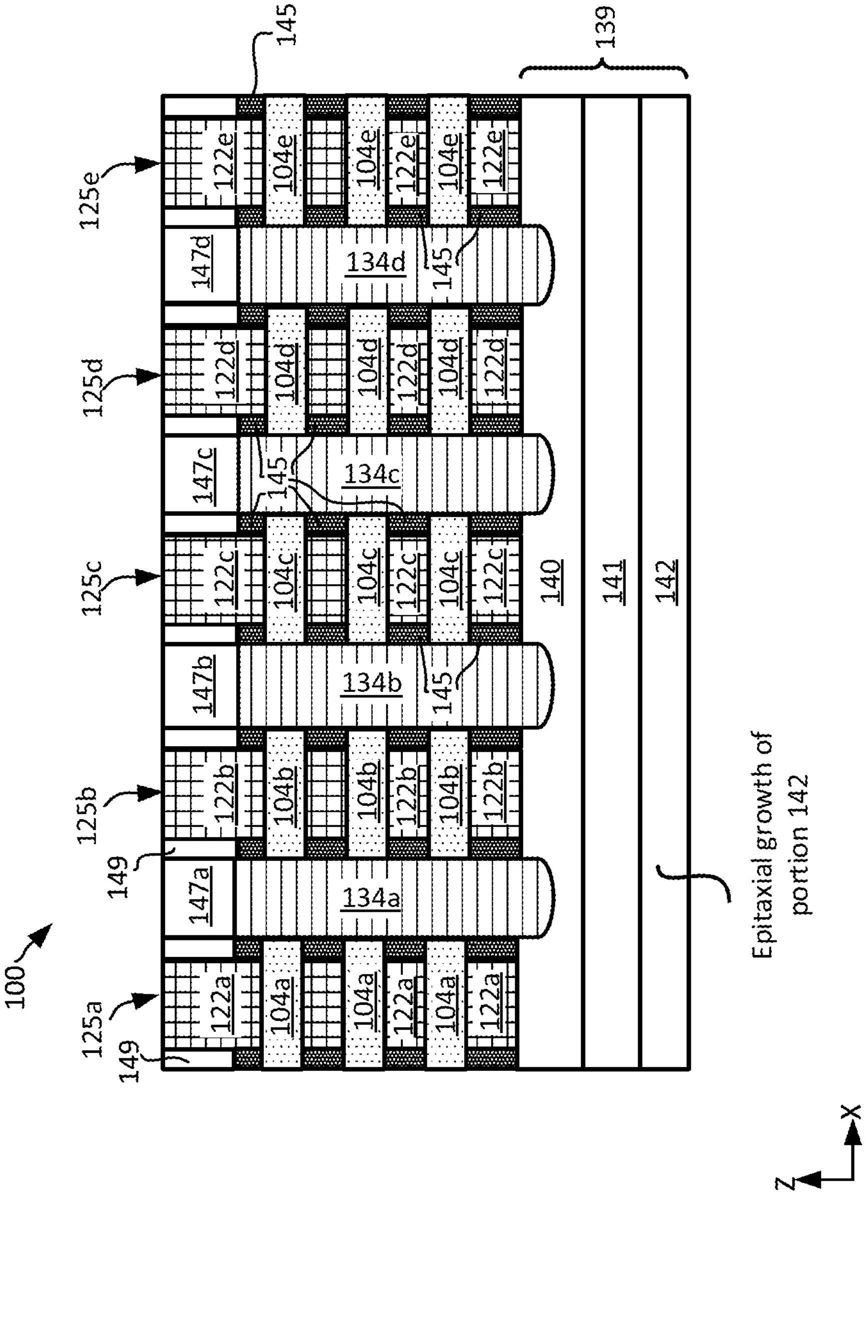
FIG. 5H2

DIODES WITH BACKSIDE CONTACT

FIELD OF THE DISCLOSURE

The present disclosure relates to integrated circuits, and more particularly, to diodes.

BACKGROUND

Diodes are used for many different applications. For example, during an electrostatic discharge (ESD) event in an integrated circuit (IC), an input/output (I/O) terminal may experience high voltage. An ESD protection diode aims to protect the IC from failure during the ESD event. For example, a diode may be used as an ESD protection device in high-speed I/O designs, where the high voltage is grounded through the diode. Diodes used for various applications, including ESD protection applications, may need to conduct high current, such as during an ESD event. Designing diodes, including those used for ESD protection, involves many non-trivial issues.

BRIEF DESCRIPTION OF THE DRAWINGS

FIGS. 5A, 5B, 5C, 5D, 5E, 5F, 5G, 5H1, 5H1, and 5I collectively illustrate cross-sectional views of a diode structure in various stages of processing in accordance with the methodology of FIG. 4, in accordance with an embodiment of the present disclosure.

Figure 1A:
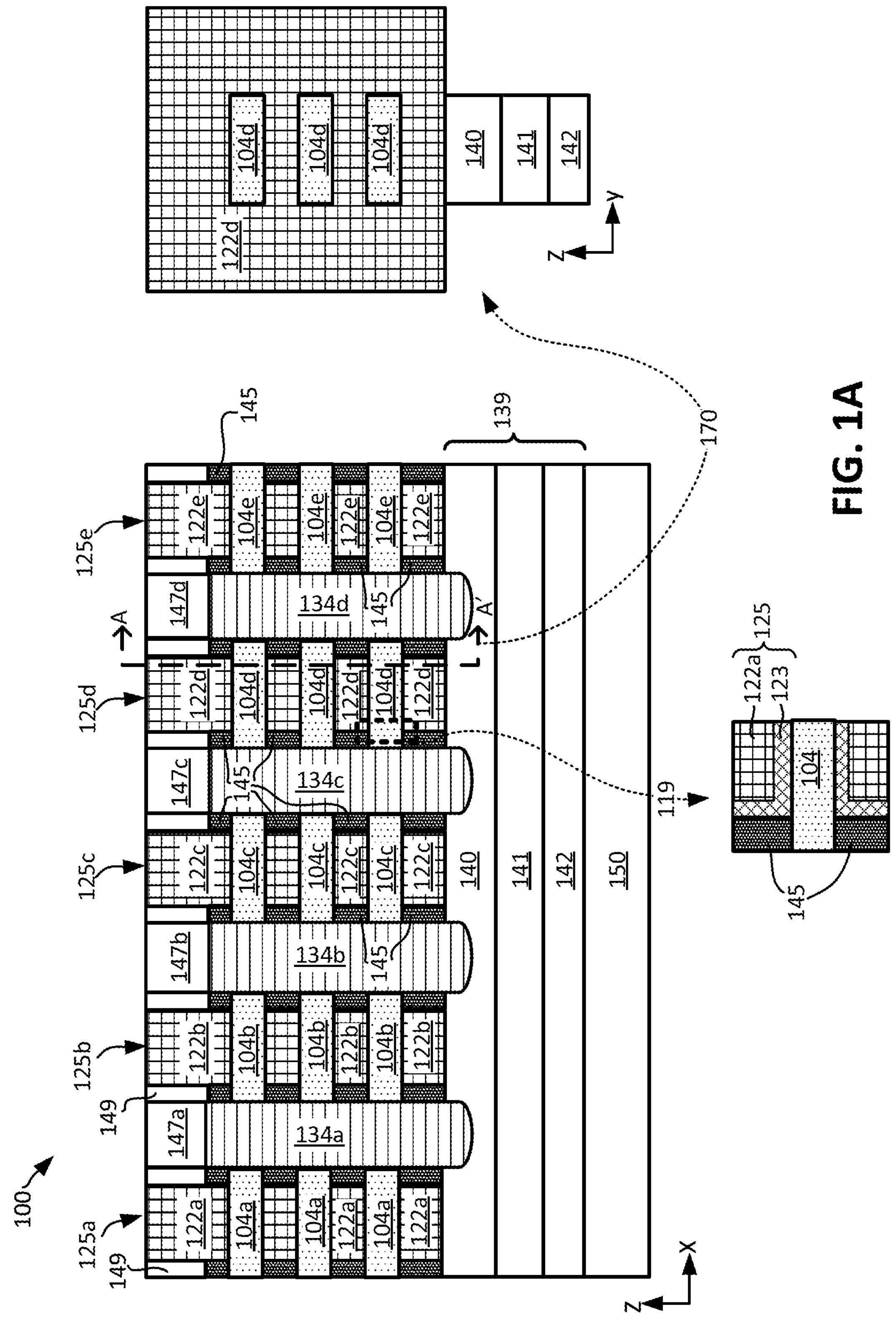
FIG. 1A illustrates a cross-sectional view of a diode structure comprising (i) a sub-fin having at least a portion that is doped with a first type of dopant, (ii) one or more diffusion regions doped with a second type of dopant, the diffusion regions in contact with the sub-fin and extending upward from the sub-fin, wherein the first type of dopant is one of a p-type or an n-type dopant, and wherein the second type of dopant is the other of the p-type or the n-type dopant, (iii) first one or more contacts above and on the corresponding ones of the diffusion regions, and (iv) a second contact below the sub-fin and in contact with the portion of the sub-fin, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Integrated circuit structures including diodes that use sub-fins for current conduction are provided herein. In an example, current of the diode is transmitted vertically through the sub-fin, e.g., through a backside conductive contact that is below, and in contact with, the sub-fin. In another example, the backside conductive contact is at least in part embedded within the sub-fin. In an example, a portion of the sub-fin, with which the backside conductive contact is in contact, is highly doped, resulting in an ohmic contact (e.g., with relatively low resistance) between the portion of the sub-fin and the backside conductive contact. In one such example, the highly doped portion of the sub-fin is formed from the backside of the integrated circuit structure. The resultant diode has a first contact (e.g., one of anode or cathode contact) that is on a front side (e.g., above) of the sub-fin, and a second contact (e.g., the other anode or cathode contact) that is on the backside (e.g., below) of the sub-fin. The diode structure can be use in any number of applications, and may be particularly well-suited for ESD protection applications.

In one embodiment, an integrated circuit structure comprises a sub-fin having at least a portion that is doped with a first type of dopant, and a diffusion region doped with a second type of dopant. The diffusion region is in contact with the sub-fin and extends upward from the sub-fin. The first type of dopant is one of a p-type or an n-type dopant, and the second type of dopant is the other of the p-type or the n-type dopant. In an example, a first conductive contact is above and on the diffusion region, and a second conductive contact is in contact with the portion of the sub-fin. The first and second conductive contacts comprise conductive material, such as metal. In an example, the diffusion region is at least a part of one of an anode or a cathode of a diode, and the portion of the sub-fin is at least a part of the other of the anode or the cathode of the diode.

In another embodiment, a diode structure comprises a sub-fin, a first conductive contact in contact with the sub-fin, a diffusion region in contact with the sub-fin, and a second conductive contact in contact with the diffusion region. In an example, the first conductive contact is one of an anode contact or a cathode contact of the diode structure, and the second conductive contact is the other of the anode contact or the cathode contact of the diode structure.

In yet another embodiment, an integrated circuit structure comprises a sub-fin, and a first diffusion region and a second diffusion region. Each of the first and second diffusion regions is in contact with, and extends upward from, the sub-fin. One or more bodies of semiconductor material extend laterally from the first diffusion region to the second diffusion region. A gate structure comprising a gate electrode and gate dielectric is on the one or more bodies. A first conductive contact comprising metal is in contact with the first diffusion region, a second conductive contact comprising metal is in contact with the second diffusion region, and a third conductive contact comprising metal is in contact with the sub-fin. Numerous configurations and variations will be apparent in light of this disclosure.

General Overview

As mentioned herein above, there are various non-trivial issues associated with designing ESD protection diodes. For example, utilizing the underlying bulk substrate as a current path for a diode increases the performance of the diode. As an example, in a gate-all-around (GAA) or a fin-based diode device, using the underlying bulk substrate for current conduction during an ESD event increases the current carrying capability of the diode, due to relatively large cross sectional area of the bulk substrate as compared to the channel region. The bulk substrate also increases lateral separation between anode and cathode contacts, thereby reducing parasitic capacitance. However, configurations where bulk substrate is removed cannot accommodate such diodes. For example, formation of backside interconnect features for signal and/or power routing may necessitate removal of the bulk substrate, in which case the diodes cannot rely on the bulk substrate for current conduction.

Accordingly, techniques are provided herein to form a vertical diode, in which a first contact (e.g., one of anode or cathode contact) is on a frontside (e.g., above) of the sub-fin, and a second contact (e.g., the other anode or cathode contact) is on a backside (e.g., below) of the sub-fin. For example, the sub-fin comprises a plurality of portions, with a PN junction of the diode is formed between two oppositely doped portions of the sub-fin. The diode current flows between the backside contact and the frontside contact, e.g., at least in part vertically through the sub-fin, thereby increasing a current rating of the diode. Also, as the anode and cathode contacts have vertical separation (e.g., separated at least by the sub-fin), parasitic capacitance between the anode and cathode contacts are low, making the diode suitable for high frequency applications.

In an example, the diode comprises a gate-all-around (GAA) device, where GAA channel regions include nanoribbons or other forms of channel regions (such as nanowires or nanosheets) around which a gate structure wraps. The diode may be a fin-based device in another example, where the fin-based channel region is wrapped in part by a gate structure (e.g., a tri-gate like structure). As will be appreciated in light of this disclosure, reference to nanoribbons or GAA as channel regions is also intended to include other gate-all-around or multi-gate channel regions, such as nanowires, nanosheets, and other such semiconductor bodies around which a gate structure can at least partly wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets, or some other body around which a gate structure can at least partially wrap, such as the semiconductor bodies of a fin-based device.

In one embodiment, the various portions of the sub-fin are arranged vertically, e.g., one above another. For example, a lower portion of the sub-fin is doped with a first type of dopant. An intermediate portion of the sub-fin (which is above the lower portion of the sub-fin) is also doped with the first type of dopant. In an example, a doping concentration of the lower portion of the sub-fin is substantially higher than a doping concentration of the intermediate portion of the sub-fin (e.g., higher by at least 3%, or at least 5%, or at least 8%, or at least 10%, or at least 13%, or at least 18%, or at least 20%, or at least 30%, or at least 40%, or at least 50%, or at least 80%, or at least 100%, or at least 200%, or at least 400%, or at least 600%, or at least 800%, or at least 1000%, or at least 2000%, or at least 3000%, or at least 4000%, or at least 5000%, or at least 6000%, or at least 7000%, or at least 8000%, or at least 9000%, or at least 10000%, for example). An upper portion of the sub-fin (which is above the intermediate portion of the sub-fin) is doped with a second type of dopant. One of the first and second types of dopants is a p-type dopant, and the other of the first and second types of dopants is an n-type dopant. The upper portion of the sub-fin is also lightly doped, e.g., similar to the doping level of the intermediate portion.

In one embodiment, one or more diffusion regions are in contact with the upper portion of the sub-fin, and extend upward from the upper portion of the sub-fin. In an example, the diffusion regions may be configured to act as anode regions or cathode regions of the diode. In an example, the diffusion regions may have similar shape and/or doping levels, and may be formed using the same processes, as one or more source and drain regions of a transistor. For example, the diode may be laterally adjacent to one or more transistors that are in the same area of a chip that includes the diode. Same (or similar) processes may be employed to form the diffusion regions in the diode and source and/or drain regions of the laterally adjacent transistors. In an example, the one or more diffusion regions are doped with the second type of dopant, e.g., are heavily doped, similar to the doping concentration of the lower portion of the sub-fin.

In one embodiment, the oppositely doped middle and upper portions of the sub-fin are in contact with each other, to form a PN junction of the diode. For example, the upper portion and the one or more diffusion regions are doped with the second type of dopant, and form one of a cathode or an anode region of the diode. The intermediate and lower portions are doped with the first type of dopant, and form the other of the cathode or the anode region of the diode.

As an example, assuming that the first type of dopant is a p-type dopant and the second type of dopant is an n-type dopant, the upper portion and the one or more diffusion regions form the cathode region of the diode, and the intermediate and lower portions form the anode region of the diode (note that dopant type and anode/cathode regions can be reversed, as will be appreciated). A conductive contact is on each diffusion region, and assuming the above discussed example doping types, the conductive contacts on the diffusion regions form the cathode contact of the diode. Note that the conductive contacts on the diffusion regions are on the frontside of the sub-fin. In one embodiment, a backside contact is below, and in contact with the lower region of the sub-fin. Assuming the above discussed example doping types, the backside contact forms the anode of the diode.

Thus, the anode contact and the cathode contact of the diode are on two opposing sides (e.g., backside and front side, respectively) of the sub-fin, resulting in low parasitic capacitance. Note that the diode is a vertical diode that has a vertical conduction path between the frontside diffusion region contacts, the diffusion regions, the upper portion, the intermediate portion, the lower portion, and the backside contact. Note that in case there are multiple diffusion regions, the corresponding multiple diffusion region contacts may be coupled to a same terminal (e.g., cathode terminal) of the diode. Thus, in this example, the multiple diffusion regions are in parallel. Increasing the number and/or cross-sectional area of the diffusion regions may increase current carrying capability of the diode, and vice versa. As discussed, the current is conducted vertically through the various portions of the sub-fin, and may not depend on a cross-sectional area of the sub-fin.

In an example, due to the lower portion of the sub-fin being doped relatively heavily, an ohmic contact is formed between the lower portion and backside contact (e.g., which may comprise metal). The lower portion being doped relatively heavily results in relatively lower resistance coupling between the lower portion and conductive backside contact. Also, no Schottky junction is formed between the backside metal contact and the heavily doped lower portion of the sub-fin.

In one embodiment, to form the diode structure discussed herein above, the intermediate and upper portions of the sub-fin are formed and appropriate doped, and the diffusion regions of the diode are formed above the sub-fin, e.g., using techniques to form GAA (or fin-based) devices, as described herein below in further detail with respect to FIGS. 5A-5F. Subsequently, from backside of the integrated circuit chip, the substrate is removed, to expose and planarize bottom surface of the intermediate portion of the sub-fin (see FIG. 5G). For example, the integrated circuit chip is flipped upside down, and the backside of the integrated circuit chip is processed from the top.

Subsequently, from backside of the integrated circuit chip, the lower portion of the sub-fin is formed (e.g., see FIGS. 5H1 and 5H2). In a first example process to form the lower portion of the sub-fin, the lower portion is formed by implanting dopants within a bottom region of the intermediate portion of the sub-fin, where the implantation occurs from the backside (e.g., see FIG. 5H1). For example, the lower and intermediate portions have the same type of dopants, with a dopant concentration of lower portion being higher than that of intermediate portion. Thus, by implanting additional dopant in the bottom region of the intermediate portion, the bottom region of the intermediate portion becomes heavily doped and transforms to the above discussed lower portion of the sub-fin.

In a second example process to form the lower portion of the sub-fin, the heavily doped lower portion is epitaxially formed, from the backside, below the intermediate portion of the sub-fin. For example, the semiconductor material (e.g., silicon) of the intermediate portion of the sub-fin facilitates epitaxial growth of the heavily doped lower portion underneath. In such an example, because intermediate and lower portions are formed using different processes, an interface, such as a seam or a grain boundary, may be formed between the intermediate and lower portions. Subsequently, from backside of the integrated circuit chip, the backside contact is formed below, and in contact with, the lower portion of the sub-fin.

The above discussed diode has various portions of the sub-fin that are arranged in a vertical stack, e.g., one below another. In an example, another diode (see FIG. 2) discussed herein has various portions of the sub-fin arranged in a laterally adjacent manner. For example, this diode has a sub-fin comprising a middle portion laterally between a first end portion and a second end portion (e.g., see FIG. 2). A first extended portion (e.g., portion 242*a* of FIG. 2) extends within the first end portion, and a second extended portion (e.g., portion 242*b* of FIG. 2) extends within the second end portion. One or more diffusion regions are above, and in contact with, the middle portion of the sub-fin.

In an example, the first and second extended portions and the first and second end portions of the sub-fin are doped with a first type of dopant. The middle portion of the sub-fin and the one or more diffusion regions are doped with a second type of dopant. In an example, a doping concentration of the first and second extended portions and the diffusion regions is substantially higher than a doping concentration of the middle portion and the first and second end portions of the sub-fin (e.g., higher by at least 3%, or at least 5%, or at least 8%, or at least 10%, or at least 13%, or at least 18%, or at least 20%, or at least 30%, or at least 40%, or at least 50%, or at least 80%, or at least 100%, or at least 200%, or at least 400%, or at least 600%, or at least 800%, or at least 1000%, or at least 2000%, or at least 3000%, or at least 4000%, or at least 5000%, or at least 6000%, or at least 7000%, or at least 8000%, or at least 9000%, or at least 10000%, for example).

In one embodiment, the oppositely doped first end portion and the middle portion of the sub-fin are in contact with each other, to form a first PN junction of a first diode. Similarly, the oppositely doped second end portion and the middle portion of the sub-fin are in contact with each other, to form a second PN junction of a second diode.

As an example, assuming that the first type of dopant is a p-type dopant and the second type of dopant is an n-type dopant, the middle portion and the one or more diffusion regions form the cathode region of the diode, and the first and second end portions and the first and second extended portions form the anode region of the diode (note that dopant type and anode/cathode regions can be reversed, as will be appreciated). A conductive contact is on each diffusion region, and assuming the above discussed example doping types, the conductive contacts on the diffusion regions form the cathode contact of the diode. Note that the conductive diffusion region contacts are on the frontside of the sub-fin. In one embodiment, a first backside contact extends within the first extended region, and a second backside contact extends within the second extended region. Assuming the above discussed example doping types, the first and second backside contacts form the anode contact of the diode.

Thus, the anode and cathode contacts of the diode are on two opposing sides (e.g., backside and front side) of the sub-fin, resulting in the low parasitic coupling. Note that the diode is a vertical diode that has at least in part vertical conduction path between the frontside diffusion region contacts, the diffusion regions, the middle portion, the end portions, the extended portions, and the backside contacts.

In an example, due to the extended portions of the sub-fin being doped relatively heavily, an ohmic contact is formed between each extended portion and the corresponding backside contact (e.g., which may comprise metal), thereby also resulting in relatively lower resistance coupling between the extended portion and conductive backside contact. Also, no Schottky junction is formed between the backside metal contact and the heavily doped extended portion of the sub-fin.

In one embodiment, to form the diode discussed herein above, a trench that extends within the sub-fin (e.g., trench 266*a*, see FIG. 7E) is formed from the frontside, and the portion of the trench extending within the sub-fin is filed with sacrificial material (e.g., se FIG. 7F). Later during the formation process, the sacrificial material is removed from the backside, and an extended portion of the sub-fin is formed within at least a part of the portion of the trench extending within the sub-fin, e.g., see FIG. 7J. The backside contact is then formed to extend within the extended portion of the sub-fin, e.g., see FIG. 7K. Further details of the formation process have been discussed herein below with respect to FIGS. 6-7L.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect a sub-fin comprising various differently doped portions, and one or more diffusion regions in contact with, and extending vertically upward from, the sub-fin. In an example, a first contact of a diode (such as one of an anode contact or a cathode contact) is above and on a diffusion region, and a second contact of the diode (such as the other of the anode contact or the cathode contact) is on a backside of the sub-fin. In an example, a portion of the sub-fin in contact with the backside contact is doped heavily (e.g., compared to a doping concentration of one or more other portions of the sub-fin), resulting is a low resistance ohmic contact between the portion of the sub-fin and the backside contact. In an example, the heavily doped portion of the sub-fin is epitaxially grown region. Numerous configurations and variations will be apparent in light of this disclosure.

Elements referred to herein with a common reference label followed by a particular number or alphabet may be collectively referred to by the reference label alone. For example, diffusion regions 134*a*, 134*b*, 134*c*, 134*d* of FIG. 1A may be collectively and generally referred to as diffusion regions 134 in plural, and diffusion region 134 in singular.

Architecture

FIG. 1A illustrates a cross-sectional view of a diode structure 100 comprising (i) a sub-fin 139 having at least a portion 142 that is doped with a first type of dopant, (ii) one or more diffusion regions 134*a*, 134*b*, 134*c*, 134*d* doped with a second type of dopant, the diffusion regions 134*a*, 134*b*, 134*c*, 134*d* in contact with the sub-fin 139 and extending upward from the sub-fin 139, wherein the first type of dopant is one of a p-type or an n-type dopant, and wherein the second type of dopant is the other of the p-type or the n-type dopant, (iii) first one or more contacts 147 above and on the corresponding ones of the diffusion regions 134*a*, 134*b*, 134*c*, 134*d*, and (iv) a second contact 150 below the sub-fin 139 and in contact with the portion 142 of the sub-fin 139, in accordance with an embodiment of the present disclosure.

As can be seen, the cross-sectional view of FIG. 1A is taken parallel to, and through, the channel regions, such that the channel regions 104 of the structure 100, and epitaxially formed diffusion regions 134 are shown. FIG. 1A also includes another cross-sectional view 170 of the structure 100, where the cross-sectional view 170 is along line A-A' of the structure 100 of FIG. 1A, and where the cross-sectional view 170 illustrates one stack of channel regions 104 and a gate electrode 122. For example, the cross-sectional view 170 illustrates a cross-sectional view of the channel regions 104 comprising nanoribbons, nanowires, or nanosheets, for example.

Referring now to the structure 100, in an example, the diffusion regions 134 may be configured to act as anode regions or cathode regions of the diode structure 100. In an example, the diffusion regions 134 may have similar shape and/or doping levels, and may be formed using the same processes, as one or more source and drain regions of a transistor. For example, the structure 100 may be laterally adjacent to one or more transistors (not illustrated) that are in the same area of a chip that includes the structure 100.

Same (or similar) processes may be employed to form the diffusion regions 134 in the structure 100 and source and/or drain regions of the laterally adjacent transistors.

The structure 100 includes a plurality of stack of channel regions 104, such as a stack of channel regions 104*a*, a stack of channel regions 104*b*, a stack of channel regions 104*c*, a stack of channel regions 104*d*, and a stack of channel regions 104*e*, and a corresponding plurality of gate structures 125*a*, 125*b*, 125*c*, 125*d*, and 125*e*, respectively. In an example, individual channel regions 104 are wrapped around by a corresponding gate structure 125.

In the example of FIG. 1A, the structure 100 is a GAA device in which the gate structure 125 wraps around individual channel regions 104. In an example, individual channel regions 104 are nanoribbons. As will be further appreciated in light of this disclosure, reference to nanoribbons is also intended to include other channel regions, such as nanowires or nanosheets, and other such semiconductor bodies around which a gate structure at least in part wraps around the channel region, such as fins. To this end, the use of a specific channel region configuration (e.g., GAA or nanoribbons) is not intended to limit the present description to that specific channel configuration. In an example, the teachings of this disclosure may also be applicable to devices in which the gate at least partially wrap around the channel region, such as finFET structures having a fin as a channel region. Thus, a stack of nanoribbon channel regions 104*a* may be replaced by a corresponding fin, in one example. Similarly, a stack of nanoribbon channel regions 104*a* may be replaced by a corresponding stack of nanowires or nanosheets, in another example.

In one embodiment, the structure 100 is formed on a sub-fin 139. In an example, the sub-fin 139 comprises appropriately doped semiconductor material, such as the same semiconductor material (or different semiconductor material) as the channel regions 104. Note that as illustrated in the cross-sectional view 170 of FIG. 1A, the sub-fin 139 may be below the channel regions 104, and not below sections that do not include the nanoribbons 104.

In an example, the sub-fin 139 has one or more portions, such as portions 140, 141, and 142. As illustrated, the portion 141 is between the portions 140 and 142. As illustrated, the portion 140 is between the portions 141, 142 and the diffusion regions 134. Although three portions are illustrated in FIG. 1A, the sub-fin 139 may be fewer or a higher number of portions in another example (e.g., see FIGS. 1C-1E described herein below).

In one embodiment, the portions 140, 141, 142 are doped differently, e.g., have different doping types and/or different doping concentrations. For example, the portions 141 and 142 are doped with a first type of dopant; and the diffusion regions 134 and the portion 140 are doped with a second type of dopant, wherein the first type of dopant is one of a p-type or an n-type dopant, and wherein the second type of dopant is the other of the p-type or the n-type dopant. This results in a PN junction between the portion 140 and portion 141, resulting in a formation of a diode, as will be described herein in further detail in turn. Example p-type dopants include boron, gallium, indium, and aluminum. Example n-type dopants include phosphorous and arsenic.

In an example, conductive contacts 147*a*, 147*b*, 147*c*, 147*d* are above and on (e.g., in contact with) the corresponding diffusion regions 134*a*, 134*b*, 134*c*, 134*d*, respectively. In an example, a conductive contact 150 is below and in contact with the portion 142 of the sub-fin 139. The conductive contacts 147 and 150 may be any suitably conductive material, such as one or more metals and/or alloys thereof. In some embodiments, conductive contacts include one or more of the same metal materials as gate electrode, or a different conductive material.

In an example, depending on whether the above discussed first or second type of dopants are p or n-type of dopants, the portions 141 and 142 form one of a cathode region or an anode region of the diode structure 100, and the conductive contact 150 in contact with the portion 142 forms a corresponding one of the cathode or anode contact; and the diffusion regions 134 and the portion 140 form the other of the cathode region or the anode region of the diode structure 100, and the conductive contacts 147 in contact with the diffusion regions 134 form corresponding ones of the cathode or anode contact.

Figure 1B:
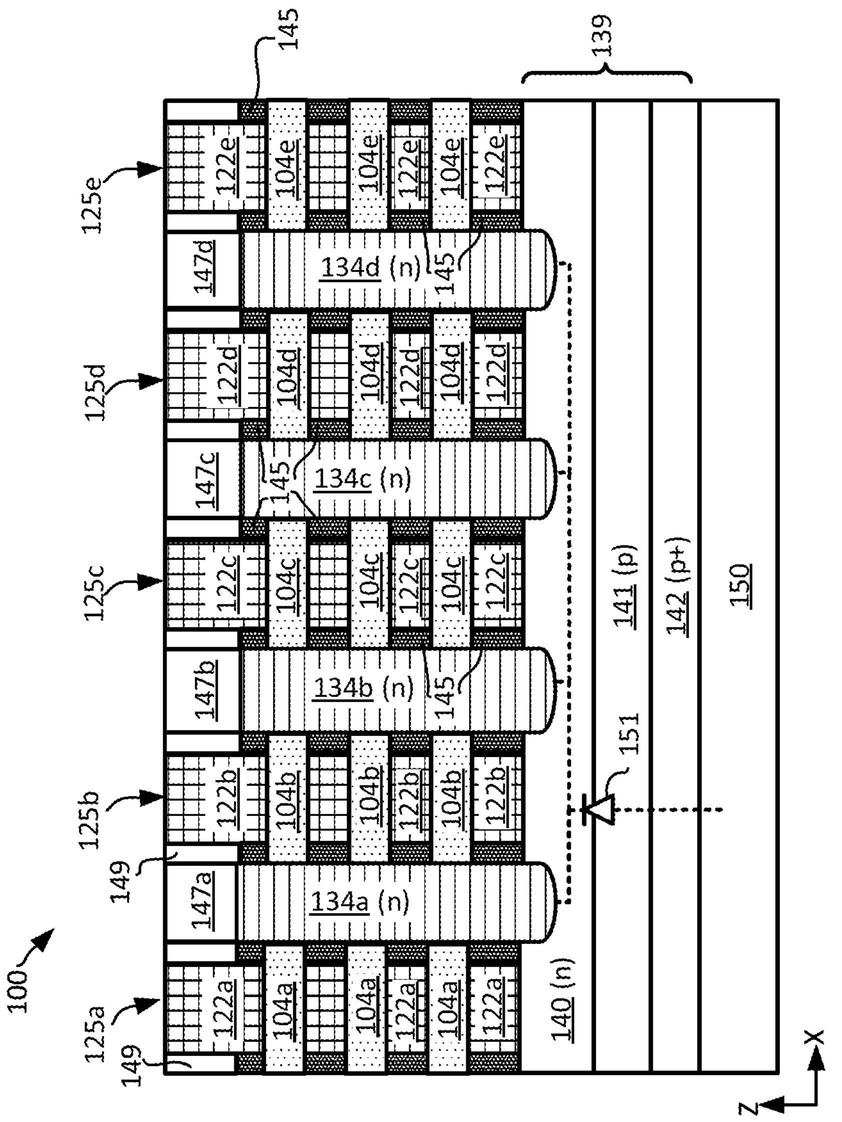
FIG. 1B schematically illustrates a diode formed within the diode structure of FIG. 1A for an example doping scheme of various components of the diode structure of FIG. 1A, in accordance with an embodiment of the present disclosure.

FIG. 1B schematically illustrates a diode 151 formed within the diode structure 100 of FIG. 1A for an example doping scheme of various components of the diode structure 100 of FIG. 1A, in accordance with an embodiment of the present disclosure. In the example of FIG. 1B, the portions 141 and 142 are doped with a p-type dopant; and the diffusion regions 134 and the portion 140 are doped with an n-type of dopant. Accordingly, the diode 151 is formed based on the PN junction between the portions 141 and 140. In the example of FIG. 1B, the portions 141 and 142 form an anode region of the diode 151, and the conductive contact 150 in contact with the portion 142 forms a corresponding anode contact. The diffusion regions 134 and the portion 140 form the cathode region of the diode 151, and the conductive contacts 147 in contact with the diffusion regions 134 form the cathode contacts. As will be appreciated, the various components of the structure 100 can be doped in an opposite manner, which will still result in formation of the diode 151, but with a reversed polarity, and the cathode and anode regions will also be reversed.

In one embodiment, a doping concentration of the portion 142 of the sub-fin 139 is higher than the doping concentration of the portion 141 of the sub-fin 139 (e.g., although the portions 141 and 142 are doped with the same type of dopant). For example, the portions 140 and 141 may be relatively lightly doped (e.g., in a concentration in the range of 1E16 to 1E21 atoms per cubic cm), whereas the portion 142 may be relatively heavily doped (e.g., in a concentration in the range of 1E19 to 1E23 atoms per cubic cm). For example, the doping concentration of the portion 142 may be greater than the doping concentration of the portions 140 and/or 141 by at least 3%, or at least 5%, or at least 8%, or at least 10%, or at least 13%, or at least 18%, or at least 20%, or at least 30%, or at least 40%, or at least 50%, or at least 80%, or at least 100%, or at least 200%, or at least 400%, or at least 600%, or at least 800%, or at least 1000%, or at least 2000%, or at least 3000%, or at least 4000%, or at least 5000%, or at least 6000%, or at least 7000%, or at least 8000%, or at least 9000%, or at least 10000%, for example.

In some embodiments, the diffusion regions 134 may also be doped heavily, e.g., similar to the doping concentration of the portion 142, e.g., in a concentration in the range of 1E19 to 1E23 atoms per cubic cm.

In an example, due to the portion 142 being doped relatively heavily, an ohmic contact is formed between the portion 142 and conductive contact 150 (e.g., which may comprise metal). The portion 142 being doped relatively heavily results in relatively lower resistance coupling between the portion 142 and conductive contact 150. Also, no Schottky junction is formed between the metal contact 150 and the portion 142 of the sub-fin 139.

Note that the diode 151 is a vertical diode that has a vertical conduction path between the conductive contact 150 and the diffusion region contacts 147*a*, 147*b*, 147*c*, 147. In an example, the diffusion region contacts 147*a*, 147*b*, 147*c*, 147*d* are coupled to a same terminal, and the diode 151 may be formed between that terminal and the contact 150. Thus, in this example, the diffusion regions 134*a*, 134*b*, 134*c*, 134*d* are in parallel. In the example of FIG. 1A, four diffusion regions 134*a*, 134*b*, 134*c*, 134*d* are illustrated, although the structure 100 can be fewer or greater number of such diffusion regions. Increasing the number of diffusion regions 134 may increase current carrying capability of the diode, and vice versa.

Note that in the vertical diode structure 100, the current carrying capability may not be based on a cross-sectional area of the sub-fin 139. For example, the sub-fin 139 may be made relatively narrower (or wider), e.g., see cross section of the sub-fin 139 in the cross-sectional view 170 of FIG. 1A, as current flows form between top and bottom surfaces of the sub-fin 139. Thus, the vertical diode structure 100 has a higher current carrying capability (which may be controlled by controlling a number and/or cross-sectional area of the diffusion regions 134) and lower resistance. Note that the diffusion region contacts 147 and the sub-fin backside contact 150 are spaced sufficiently apart, resulting in low parasitic capacitance coupling between the diffusion region contacts 147 and the sub-fin backside contact 150. Thus, in an example, the diode structure 100 can be used for high frequency applications.

The diode structure 100 can be used for many different applications, such as for ESD protection of an integrated circuit chip. For example, I/O terminals of the chip may occasionally experience ESD events. The diode structure 100 may be coupled to the I/O terminal of the chip, and the diode structure 100 may ground the high ESD voltage and/or current to the ground terminal, thereby preventing or at least reducing damage to the circuits of the chip due to the ESD event. The diode structure 100 can also be used for other applications in which a diode is used, such as for temperature sensing and/or other appropriate diode application areas.

Note that although FIGS. 1A and 1B illustrates the sub-fin 139 having portions 140, 141, and 142, one or more portions of the sub-fin 139 may be absent in another example. For example, FIGS. 1C, 1D, and 1E illustrate corresponding diode structures 100*c*, 100*d*, and 100*e*, respectively, where each of the diode structures 100*c*, 100*d*, and 100*e* of FIGS. 1C-1E are in part similar to the diode structure 100 of FIG. 1A, and where each of the diode structures 100*c*, 100*d*, and 100*e* of FIGS. 1C-1E lacks a corresponding one or more portions of the sub-fin 139 of the diode structure 100 of FIG. 1A, in accordance with an embodiment of the present disclosure.

Figure 1C:
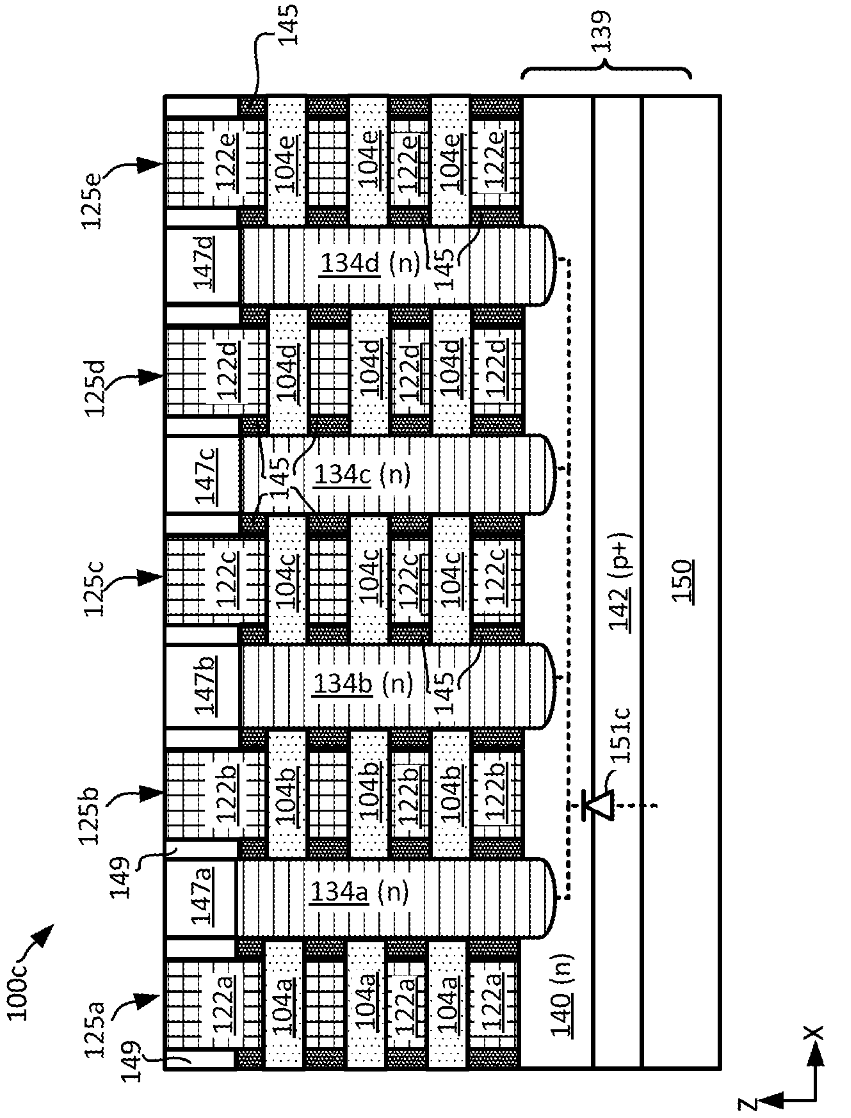
FIGS. 1C, 1D, and 1E illustrate three corresponding diode structures, where each of the diode structures of FIGS. 1C-1E are in part similar to the diode structure of FIG. 1A, and where each of the diode structures of FIGS. 1C-1E lacks a corresponding one or more portions of the sub-fin of the diode structure of FIG. 1A, in accordance with an embodiment of the present disclosure.

Referring now to FIG. 1C, unlike the diode structure 100 of FIG. 1A, the diode structure 100*c* of FIG. 1C lacks the portion 141. An example doping scheme is illustrated in FIG. 1C, in which the portion 142 is doped with p+ type dopant (e.g., heavily doped with p type dopant), the portion 140 is lightly doped with n-type dopant, and the diffusion regions 134*a*, 134*b*, 134*c*, 134*d* are heavily doped with n-type dopant. Accordingly, a PN-junction is formed between the portions 142 and 140, resulting in a diode 151*c* between the backside contact 150 and the diffusion region contacts 147*a*, 147*b*, 147*c*, 147*d*. Various components of FIG. 1C will be apparent, based on the discussion with respect to the corresponding components of FIG. 1A.

Figure 1D:
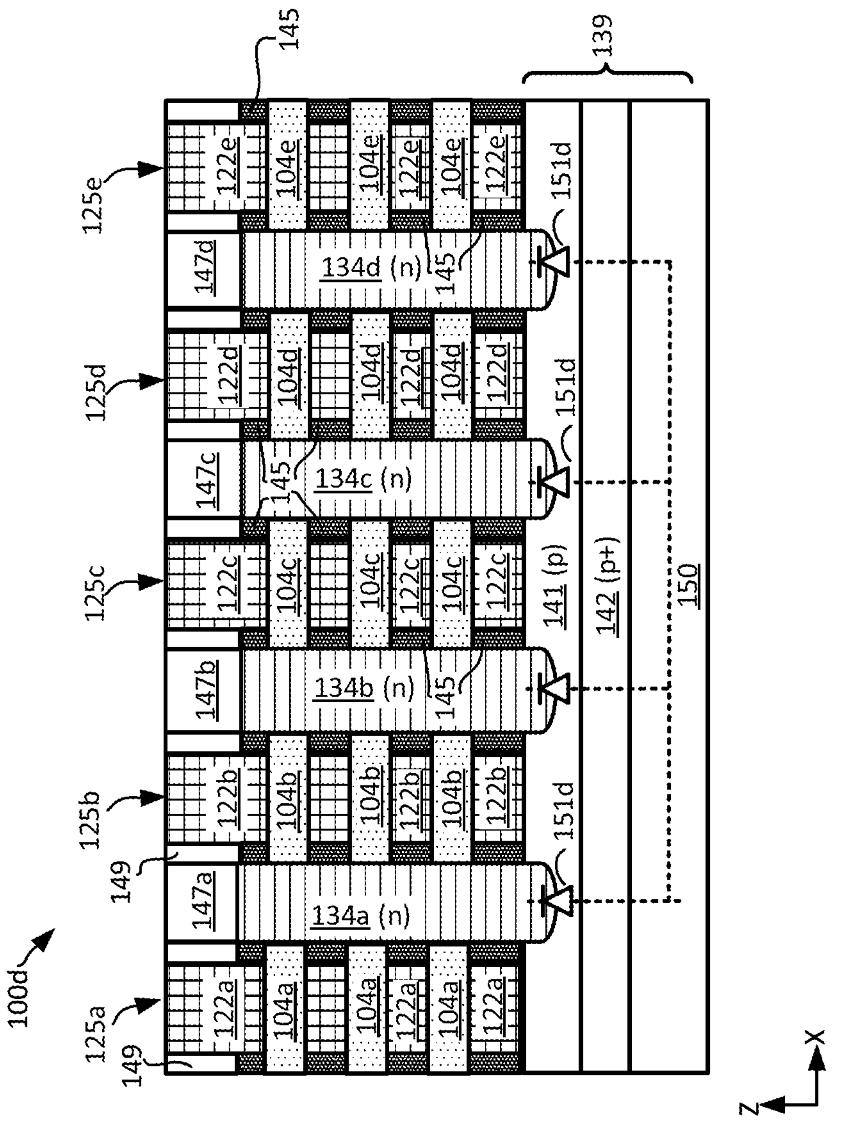

Referring now to FIG. 1D, unlike the diode structure 100 of FIG. 1A, the diode structure 100*d* of FIG. 1D lacks the portion 140. An example doping scheme is illustrated in FIG. 1D, in which the portion 142 is doped with p+ type dopant (e.g., heavily doped with p type dopant), the portion 141 is lightly doped with p-type dopant, and the diffusion regions 134*a*, 134*b*, 134*c*, 134*d* are heavily doped with n-type dopant. Accordingly, PN-junctions are formed between the portion 141 and each of the diffusion regions 134*a*, 134*b*, 134*c*, 134*d*, resulting in four diodes 151*d* between the backside contact 150 and each of the diffusion region contacts 147*a*, 147*b*, 147*c*, 147*d*, respectively. Various components of FIG. 1D will be apparent, based on the discussion with respect to the corresponding components of FIG. 1A.

Figure 1E:
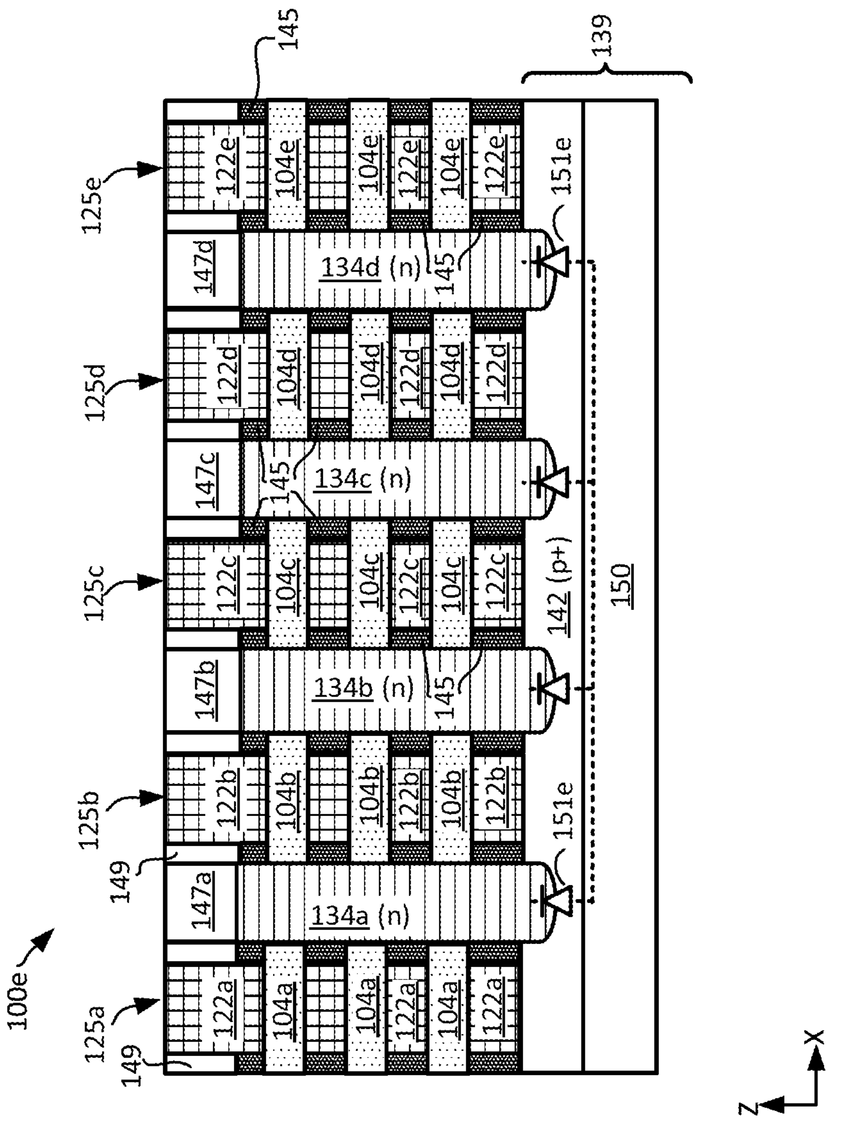

Referring now to FIG. 1E, unlike the diode structure 100 of FIG. 1A, the diode structure 100*e* of FIG. 1E lacks the portions 140 and 141. An example doping scheme is illustrated in FIG. 1E, in which the portion 142 is doped with p+ type dopant (e.g., heavily doped with p type dopant), and the diffusion regions 134*a*, 134*b*, 134*c*, 134*d* are heavily doped with n-type dopant. Accordingly, PN-junctions are formed between the portion 142 and each of the diffusion regions 134*a*, 134*b*, 134*c*, 134*d*, resulting in four diodes 151*e* between the backside contact 150 and each of the diffusion region contacts 147*a*, 147*b*, 147*c*, 147*d*. Various components of FIG. 1E will be apparent, based on the discussion with respect to the corresponding components of FIG. 1A.

Thus, in each of FIGS. 1A, 1C, 1D, 1E, the heavily doped p-type portion 142 is in contact with the backside contact 150. As described herein above, an ohmic contact is formed between the portion 142 and conductive contact 150 (e.g., which may comprise metal) in each of FIGS. 1A-1E. The portion 142 being doped relatively heavily results in relatively lower resistance coupling between the portion 142 and conductive contact 150. Also, no Schottky junction is formed between the metal contact 150 and the portion 142 of the sub-fin 139.

Discussed herein below are various components of the diode structure 100 of FIG. 1A, and such discussion may also at least in part be applicable to various other diode structure discussed herein, such as with respect to FIGS. 1C-1E.

As illustrated in FIG. 1A, in an example, the structure 100 comprises a plurality of stacks of nanoribbons 104, such as stacks of nanoribbons 104*a*, 104*b*, 104*c*, 104*d*, 104*e*. In the example of FIG. 1A, each vertical stack of nanoribbons 104 comprises three nanoribbons. The number of nanoribbons 104 in each vertical stack of nanoribbon (i.e., three nanoribbons per stack) is merely an example, and each vertical stack of nanoribbons may comprise a different number of nanoribbons, such as one, two, four, five or higher number of nanoribbons.

In one embodiment, the structure 100 of FIG. 1A comprises the diffusion regions 134, the nanoribbons 104*b*, 104*c*, 104*d* laterally extending between various diffusion regions 134. Also, note that in one example, the nanoribbons 104*a* extend from the diffusion region 134*a* and away from the diffusion region 134*b*, such that no diffusion region is coupled to a left end of the nanoribbons 104*a* in an example, although in another example further diffusion region may be coupled to the left end of the nanoribbons 104*a*. Similarly, the nanoribbons 104*e* extend from the diffusion region 134*d* and away from the diffusion region 134*c*, such that no diffusion region is coupled to a right end of the nanoribbons 104*e* in an example, although in another example further diffusion region may be coupled to the right end of the nanoribbons 104*e*.

Note that each of the diffusion region contacts 147*a*, 147*b*, 147*c*, 147*d* is coupled to a same terminal, and similarly, each of the diffusion regions are coupled to the same sub-fin portion 140. Accordingly, in an example, during operation, the diffusion regions 134*a*, 134*b*, 134*c*, 134*d* may be substantially at the same potential. Accordingly, no substantial current may flow though individual nanoribbons 104. Rather, as discussed, in the vertical diode structure 100, the current conduction is through the vertical path of diffusion region contacts 147, diffusion regions 134, portions 140, 141, 142 of the sub-fin 139, and the contact 150.

Although the nanoribbons 104*a*, 104*b*, 104*c*, 104*d*, and 104*e* may not provide much useful functionality to the structure 100, the nanoribbons 104*a*, 104*b*, 104*c*, 104*d*, and 104*e* are formed as a standard process of forming nanoribbons within a section of a die comprising the structure 100. For example, the nanoribbons 104*a* and 104*b*, along with corresponding sacrificial material and dummy gate stack define a diffusion region trench therebetween (e.g., trench 512*a*, see FIG. 5C) where the diffusion region 134*a* is eventually formed, thereby facilitating formation of the diffusion region 134*a*.

The nanoribbons 104 may comprise any appropriate semiconductor material, such as group IV material (e.g., silicon, germanium, or SiGe) or group III-V materials (e.g., indium gallium arsenide). In other embodiments, the nanoribbons 104 may be replaced by fins on which the corresponding gate structures are formed to provide double-gate or tri-gate configurations (as opposed to gate-all-around configurations with nanoribbons or wires). The nanoribbons 104 may be doped. For example, nanoribbons 104 may have the same type of doping as the diffusion regions 134. In other examples, the nanoribbons 104 may be partially doped (e.g., such as the example case where a nanoribbon is doped at its ends but not in the middle portion), or undoped, and may be shaped or sculpted during the gate formation process, according to some embodiments. In some cases, the nanoribbons 104 may be a multilayer structure, such as a SiGe body cladded with germanium, or a silicon body cladded with SiGe. Any number of channel configurations can be used.

According to some embodiments, the diffusion regions 134 are epitaxial regions that are provided using an etch-and-replace process. In other embodiments one or more of the diffusion regions could be, for example, implantation-doped native portions of the semiconductor fins or substrate. Any semiconductor materials suitable for source and drain regions can be used (e.g., group IV and group III-V semiconductor materials). The diffusion regions may include multiple layers such as liners and capping layers to improve contact resistance. Any semiconductor materials suitable for source and drain regions can be used (e.g., group IV and group III-V semiconductor materials) for the diffusion regions 134.

As illustrated, each diffusion region 134 in part extend within the sub-fin 139, e.g., within portion 140 of the sub-fin 139. Extension of the diffusion regions 134 within the sub-fin 139 results in a better contact between the sub-fin 139 and the diffusion regions 134.

In some embodiments, conductive contacts 147*a*, 147*b*, 147*c*, 147*d* are formed over various diffusion regions 134*a*, 13*b*, 134*c*, 134*d*, respectively, of the structure 100. The conductive contacts 147 may be any suitably conductive material, such as one or more metals and/or alloys thereof. In some embodiments, conductive contacts include one or more of the same metal materials as gate electrode, or a different conductive material.

The gate structure 125*a* contacts and wraps around individual nanoribbons 104*a*, the gate structure 125*b* contacts and wraps around individual nanoribbons 104*b*, the gate structure 125*c* contacts and wraps around individual nanoribbons 104*c*, the gate structure 125*d* contacts and wraps around individual nanoribbons 104*d*, and the gate structure 125*e* contacts and wraps around individual nanoribbons 104*e*. Note that in another example where the structure 100 includes a fin instead of a stack of nanoribbons, the corresponding gate structure is on and partly wraps around (e.g., is on three sides) the fin.

Note that in an example, the gate structures 125*a*, 125*b*, 125*c*, 125*d*, and/or 125*e* are not contacted. Thus, there are no corresponding gate contacts for these gate structures. In an example, the gate structures 125*a*, 125*b*, 125*c*, 125*d*, and/or 125*e* are inactive or non-functional gate structures and are electrically floating, and do not impart any meaningful functionality in the structure 100. In an example, the gate structures 125 are present in the structure 100, e.g., because gate structures are formed with regular pitch or interval within at least a section of a die that includes the structure 100, and the gate structures 125 are formed as a part of gate structure formation processes for multiple devices within a section of the chip that includes the structure 100.

In one embodiment, each gate structure 125 includes a gate dielectric 123 that wraps around middle portions of each nanoribbon, and a gate electrode 122 that wraps around the gate dielectric 123. The gate dielectric 123 is illustrated in an expanded view of a section 119 of the structure 100. As illustrated, the gate electrode 122*a* of the gate structure 125*a* wraps around middle portions of individual nanoribbons 104*a*, the gate electrode 122*b* of the gate structure 125*b* wraps around middle portions of individual nanoribbons 104*b*, the gate electrode 122*c* of the gate structure 125*c* wraps around middle portions of individual nanoribbons 104*c*, and so on. Note that the middle portion of each nanoribbon 104 is between a corresponding first end portion and a second end portion, where the first end portions of the nanoribbons of a stack is wrapped around by corresponding first inner gate spacer 145, and where the second end portions of the nanoribbons of a stack is wrapped around by corresponding second inner gate spacer 145.

In some embodiments, the gate dielectric 123 may include a single material layer or multiple stacked material layers. The gate dielectric 123 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 123 is lanthanum. In some embodiments, the gate dielectric can be annealed to improve its quality when high-k dielectric material is used. In some embodiments, the gate dielectric 123 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer. The gate dielectric 123 is present around middle portions of each nanoribbon, and although not illustrated, may also be present over sub-fin 139, and/or on inner sidewalls of the inner gate spacers 145.

In one embodiment, one or more work function materials (not illustrated in FIG. 1A) may be included around the nanoribbons 104. Note that work function materials are called out separately, but may be considered to be part of the gate electrodes. In this manner, a gate electrode 122 may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons. In still other embodiments, there may be insufficient room for any gate fill material, after deposition of work function material (i.e., a given gate electrode may be all work function material and no fill material). In an example, the gate electrodes 122 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example. Numerous gate structure configurations can be used along with the techniques provided herein, and the present disclosure is not intended to be limited to any particular such configurations.

Each gate structure 125 also includes two corresponding inner gate spacers 145 that extend along the sides of the gate electrode 122, to isolate the gate electrode 122 from an adjacent diffusion region (or from the dielectric material 165, e.g., for the right end of nanoribbons 104*b* or 104*e*). The inner gate spacers 145 at least partially surround the end portions of individual nanoribbons. In one embodiment, gate spacers 145 may include a dielectric material, such as silicon nitride, for example.

Figure 2:
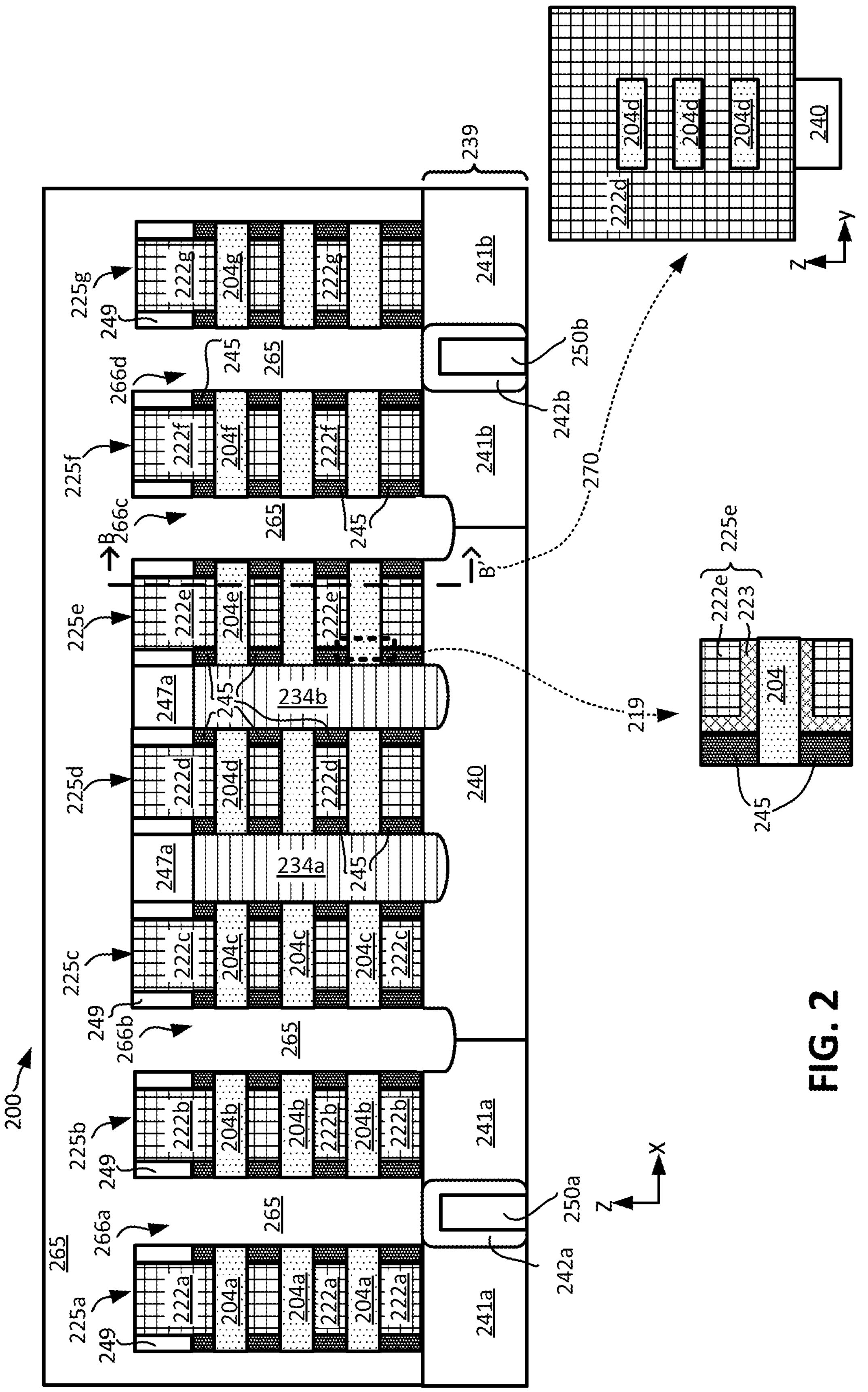
FIG. 2 illustrates a cross-sectional view of a diode structure comprising (i) a sub-fin having at least a portion that is doped with a first type of dopant, (ii) one or more diffusion regions doped with a second type of dopant, the diffusion regions in contact with the sub-fin and extending upward from the sub-fin, wherein the first type of dopant is one of a p-type or an n-type dopant, and wherein the second type of dopant is the other of the p-type or the n-type dopant, (iii) first one or more contacts above and on the corresponding ones of the diffusion regions, and (iv) at least a second contact extending at least in part within, in contact with, the portion of the sub-fin, in accordance with an embodiment of the present disclosure.

FIG. 2 illustrates a cross-sectional view of a diode structure 200 comprising (i) a sub-fin 239 having at least a portion 242*a* that is doped with a first type of dopant, (ii) one or more diffusion regions 234*a*, 234*b* doped with a second type of dopant, the diffusion regions 234*a*, 234*b* in contact with the sub-fin 239 and extending upward from the sub-fin 239, wherein the first type of dopant is one of a p-type or an n-type dopant, and wherein the second type of dopant is the other of the p-type or the n-type dopant, (iii) first one or more contacts 247*a*, 247*b* above and on the corresponding ones of the diffusion regions 234*a*, 234*b*, and (iv) at least a second contact 250*a* extending at least in part within, in contact with, the portion 242*a* of the sub-fin 239, in accordance with an embodiment of the present disclosure.

Similar components in the structures 200 and 100 are labelled similarly. For example, similar to the gate structures 125 of the structure 100, the structure 200 comprises gate structures 225*a*, 225*b*, . . . , 225*g*, each comprising corresponding gate electrode 222 and gate dielectric 223 (gate dielectric 223 illustrated in an expanded view of a section 219). Also, similar to the nanoribbons 104 of the structure 100, the structure 200 comprises stacks of nanoribbons 204*a*, 204*b*, . . . , 204*g*. Furthermore, similar to the diffusion regions 134 of the structure 100, the structure 200 comprises diffusion regions 234*a*, 234*b*.

In one embodiment, the structure 200 is formed on the sub-fin 239. In an example, the sub-fin 239 has one or more portions, such as portion 240 laterally between portions 241*a* and 241*b*. In an example, the sub-fin 239 also comprises portion 242*a* extending within, and laterally adjacent to, the portion 241*a*; and portion 242*b* extending within, and laterally adjacent to, the portion 241*b*, as illustrated in FIG. 2.

In one embodiment, each of conductive contacts 250*a*, 250*b* extends at least in part within the sub-fin 239, e.g., from the backside of the structure 200. For example, the each of conductive contacts 250*a*, 250*b* extends at least in part within the portions 242*a*, 242*b*, respectively, of the sub-fin 239. For example, the portion 242*a* of the sub-fin 239 separates the conductive contact 250*a* from other portions (such as portion 241*a*) of the sub-fin 239. Similarly, the portion 242*b* of the sub-fin 239 separates the conductive contact 250*b* from other portions (such as portion 241*b*) of the sub-fin 239. The conductive contacts 250*a*, 250*b* may be any suitable conductive material, such as one or more metals and/or alloys thereof. In some embodiments, conductive contacts 250 include one or more of the same metal materials as gate electrode, or a different conductive material.

In an example, the portion 240 of the structure 200 is doped similar to the portion 140 of the structure 100, the portions 241*a*, 241*b* of the structure 200 are doped similar to the portion 141 of the structure 100, and the portions 242*a*, 242*b* of the structure 200 are doped similar to the portion 142 of the structure 100.

Similar to the various portions of the sub-fin 139 of the structure 100, in one embodiment, the portions 240, 241*a*, 241*b*, 242*a*, 242*b* are doped differently, e.g., have different doping types and/or different doping concentrations. For example, the portions 241*a*, 241*b* and 242*a*, 242*b* are doped with a first type of dopant; and the diffusion regions 234 and the portion 240 are doped with a second type of dopant, wherein the first type of dopant is one of a p-type or an n-type dopant, and wherein the second type of dopant is the other of the p-type or the n-type dopant. This results in a first PN junction between the portion 240 and portion 241*a*, and a second PN junction between the portion 240 and portion 241*b*, resulting in a formation of two diodes 251*a*, 251*b* (see FIG. 3), as will be described herein in further detail in turn. Example p-type dopants include boron, gallium, indium, and aluminum. Example n-type dopants include phosphorous and arsenic.

In an example, conductive contacts 247*a*, 247*b* are above and on the corresponding diffusion regions 234*a*, 234*b*, respectively. In an example, each of the conductive contacts 250*a*, 250*b* extends from the backside at least in part within, and in contact with, the portions 242*a*, 242*b*, respectively, of the sub-fin 239.

In an example, depending on whether the above discussed first or second type of dopants are p or n-type of dopants, the portions 241*a*, 241*b*, and 242*a*, 242*b* form one of a cathode region or an anode region of the diode structure 200, and the conductive contacts 250*a*, 250*b* form a corresponding one of the cathode or anode contact; and the diffusion regions 234*a*, 234*b* and the portion 240 form the other of the cathode region or the anode region of the diode structure 200, and the conductive contacts 247 in contact with the diffusion regions 234 form corresponding ones of the cathode or anode contact.

Figure 3:
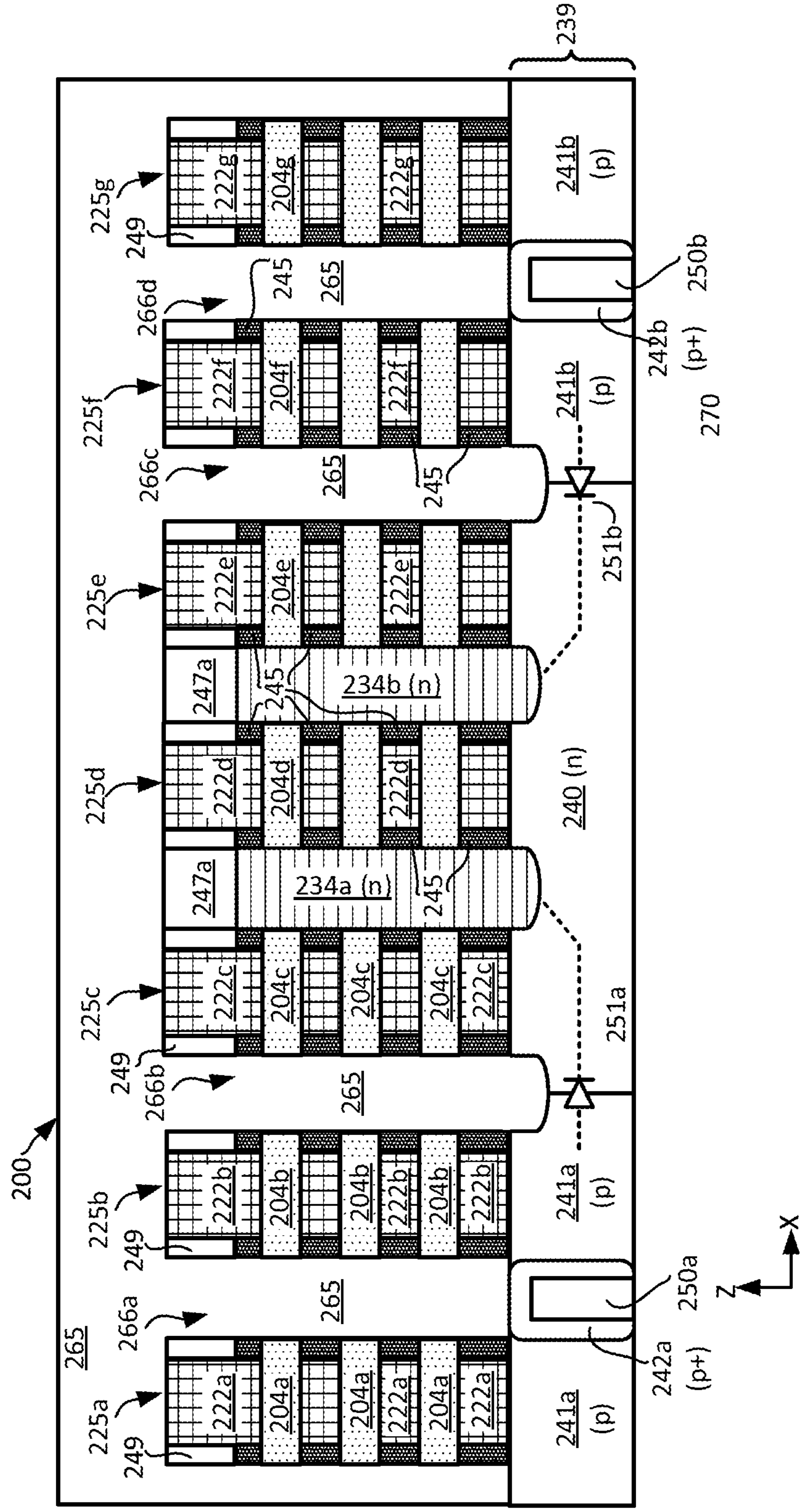
FIG. 3 schematically illustrates two diodes formed within the diode structure of FIG. 2 for an example doping scheme of various components of the structure of FIG. 2, in accordance with an embodiment of the present disclosure.

FIG. 3 schematically illustrates two diodes 251*a*, 252*b* formed within the diode structure 200 of FIG. 2 for an example doping scheme of various components of the structure 200 of FIG. 2, in accordance with an embodiment of the present disclosure. In the example of FIG. 3, the portions 241*a*, 241*b*, 242*a*, 242*b* are doped with a p-type dopant; and the diffusion regions 234 and the portion 240 are doped with an n-type of dopant. Accordingly, the diode 251*a* is formed based on the PN junction between the portions

241*a* and 240, and the diode 251*b* is formed based on the PN junction between the portions 241*b* and 240.

In the example of FIG. 3, the portions 241*a*, 242*a* form an anode region of the diode 251*a*, and the conductive contact 250*a* in contact with the portion 242*a* forms a corresponding anode contact. The diffusion region 234*a* and the portion 240 form the cathode region of the diode 251*a*, and the conductive contact 247*a* in contact with the diffusion region 234*a* form the cathode contact.

Similarly, in the example of FIG. 3, the portions 241*b*, 242*b* form an anode region of the diode 251*b*, and the conductive contact 250*b* in contact with the portion 242*b* forms a corresponding anode contact. The diffusion region 234*b* and the portion 240 form the cathode region of the diode 251*b*, and the conductive contact 247*b* in contact with the diffusion region 234*b* form the cathode contact.

As will be appreciated, the various components of the structure 200 can be doped in an opposite manner, which will still result in formation of the diodes 251*a*, 25*ab*, but with a reversed polarity, and the cathode and anode regions will also be reversed.

In one embodiment, a doping concentration of the portions 242*a*, 242*b* of the sub-fin 239 is higher than the doping concentration of the portions 241*a*, 242*b* of the sub-fin 239 (e.g., although the portions 141 and 142 are doped with the same type of dopant), similar to the doping concentration of the portion 142 of the sub-fin 139 being higher than the doping concentration of the portion 141 of the sub-fin 139 of the structure 100, as described herein above. For example, the portions 240 and 241*a*, 241*b* may be relatively lightly doped (e.g., in a concentration in the range of 1E16 to 1E21 atoms per cubic cm), whereas the portions 242*a*, 242*b* may be relatively heavily doped (e.g., in a concentration in the range of 1E19 to 1E23 atoms per cubic cm). For example, the doping concentration of the portions 242*a*, 242*b* may be greater than the doping concentration of the portions 240 and/or 241*a*, 241*b* by at least 3%, or at least 5%, or at least 8%, or at least 10%, or at least 13%, or at least 18%, or at least 20%, or at least 30%, or at least 40%, or at least 50%, or at least 80%, or at least 100%, or at least 200%, or at least 400%, or at least 600%, or at least 800%, or at least 1000%, or at least 2000%, or at least 3000%, or at least 4000%, or at least 5000%, or at least 6000%, or at least 7000%, or at least 8000%, or at least 9000%, or at least 10000%, for example.

In some embodiments, the diffusion regions 234 may also be doped heavily, e.g., similar to the doping concentration of the portions 242*a*, 242*b*, e.g., in a concentration in the range of 1E19 to 1E23 atoms per cubic cm.

In an example, due to the portions 242 being doped relatively heavily, an ohmic contact is formed between the portion 242*a* and conductive contact 250*a*, and another ohmic contact is formed between the portion 242*b* and conductive contact 250*b*. The portions 242*a*, 242*b* being doped relatively heavily results in relatively lower resistance coupling between each portion 242 and the corresponding conductive contact 250. Also, no Schottky junction is formed between a metal contact 250 and a corresponding portion 242.

Note that similar to the diode 151 of FIG. 1B, the diodes 251*a*, 251*b* are vertical diode that has at least in part vertical conduction path between a conductive contact 250 and a corresponding diffusion region contact 247. In an example, the vertical diode structure 200 has a higher current carrying capability (which may be controlled by controlling a number and/or cross-sectional area of the diffusion regions 234) and lower resistance. Note that the diffusion region contacts 247 and the sub-fin backside contacts 250 are spaced sufficiently apart, resulting in low parasitic capacitance coupling between the diffusion region contacts 247 and the sub-fin backside contact 250. Thus, in an example, the diode structure 200 can be used for high frequency applications. The diode structure 100 can be used for many different applications, such as for ESD protection of an integrated circuit chip, and/or for other applications such as for temperature sensing.

As illustrated in FIG. 2, in an example, the structure 200 comprises a plurality of stacks of nanoribbons 204, such as stacks of nanoribbons 204*a*, 204*b*, . . . , 204*e*, e.g., similar to the diode structure 100 of FIG. 1A. Note that there is no diffusion region between some adjacent gate structures, such as between the gate structures 225*a* and 225*b*. For example, trenches 266*a*, 266*b*, 266*c*, 266*d* comprising dielectric material 265 are between these adjacent gate structures, as illustrated in FIG. 2. For example, trench 266*a* is between gate structures 225*a* and 225*b*, trench 266*b* is between gate structures 225*b* and 225*c*, trench 266*c* is between gate structures 225*e* and 225*f*, and trench 266*d* is between gate structures 225*f* and 225*g*.

Note that trenches 266*b* and 266*c* make an undercut (e.g., extends at least in part) within the sub-fin 239. For example, trench 266*b* is above a PN junction between the portions 241*a* and 240 of the sub-fin 239, and trench 266*c* is above another PN junction between the portions 241*b* and 240 of the sub-fin 239. Trench 266*a* is above the portion 242*a* and conductive backside contact 250*a*, and trench 266*d* is above the portion 242*b* and conductive backside contact 250*b*, as illustrated in FIG. 2.

Note that in an example, each of the diffusion region contacts 247*a*, 247*b* is coupled to a same terminal. Accordingly, in an example, during operation, the diffusion regions 234*a*, 234*b* may be substantially at the same potential. Accordingly, no substantial current may flow though individual nanoribbons 204*d* that are between the diffusion regions 234*a* and 234*b*. Furthermore, each of the nanoribbons 204*a*, 204*b*, 204*c*, 204*e*, 204*f*, 204*g* lacks any diffusion region in contact with one or both end of the nanoribbons, and hence, also cannot conduct any current. Rather, as discussed, in the vertical diode structure 200, the current conduction is through the at least in part vertical path of diffusion region contacts 247, diffusion regions 234, portions 240, 241, 242 of the sub-fin 239, and the contacts 250. Although the nanoribbons 204*a* may not provide much useful functionality to the structure 200, the nanoribbons 204 are formed as a standard process of forming nanoribbons within a section of a die comprising the structure 200.

Example material and/or structure of individual nanoribbon 204 are similar to those discussed with respect to the structure 100 of FIG. 1A. Example material and/or structure of individual diffusion regions 234 are similar to those discussed with respect to the structure 100 of FIG. 1A. Example material and/or structure of individual gate structures 225 (e.g., including gate electrodes 222 and gate dielectric 223), and inner gate spacers 245 are similar to those discussed with respect to the structure 100 of FIG. 1A.

Figure 4:
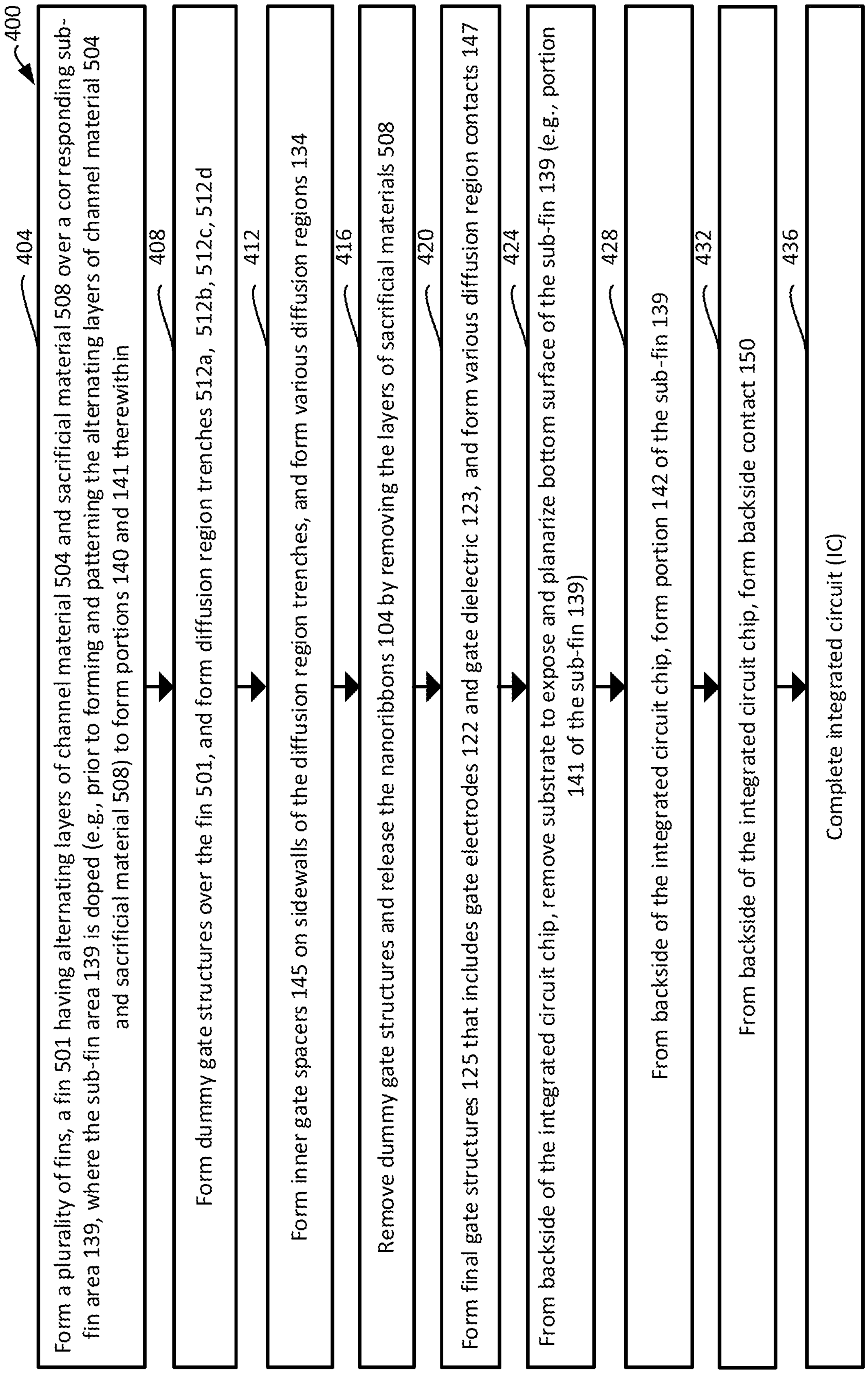
FIG. 4 illustrates a flowchart depicting a method of forming the diode structure of FIGS. 1A-1E, in accordance with an embodiment of the present disclosure.

FIG. 4 illustrates a flowchart depicting a method 400 of forming the diode structure of FIGS. 1A-1E, in accordance with an embodiment of the present disclosure. FIGS. 5A, 5B, 5C, 5D, 5E, 5F, 5G, 5H1, 5H1, and 5I collectively illustrate cross-sectional views of a diode structure in various stages of processing in accordance with the methodology 400 of FIG. 4, in accordance with an embodiment of the present disclosure. FIGS. 4 and 5A-5I will be discussed in unison.

Figure 5A:
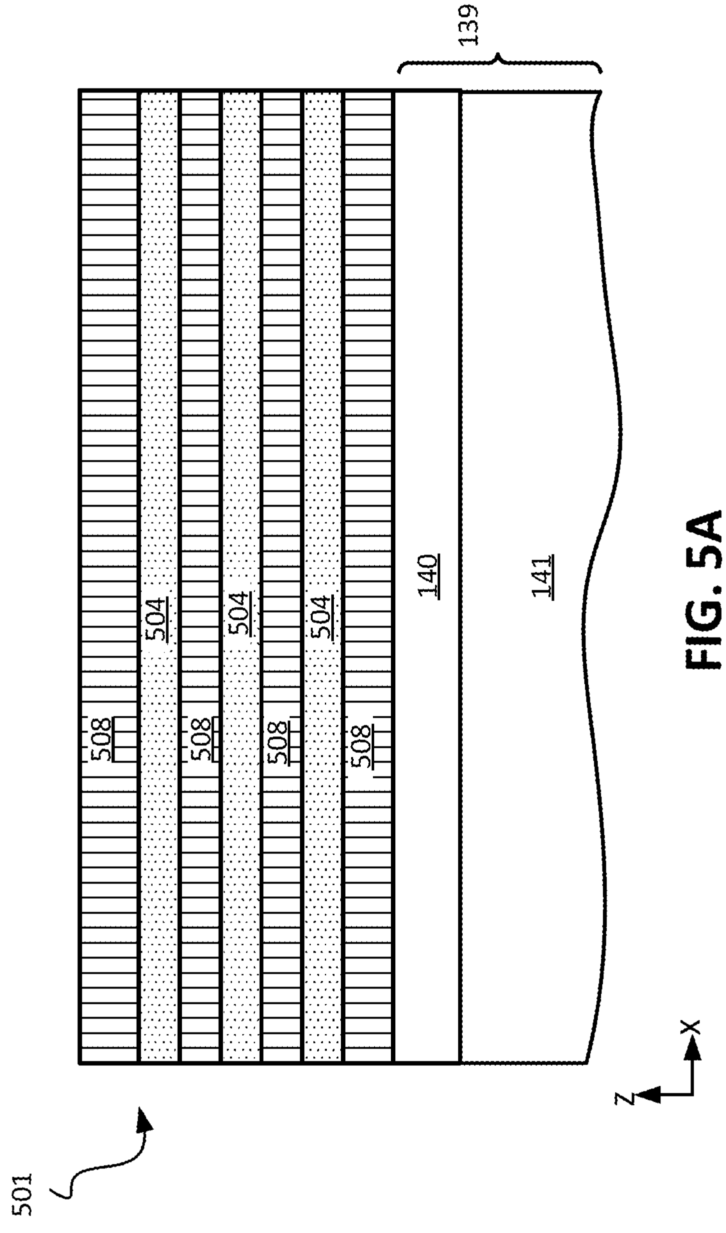
Figure 5B:
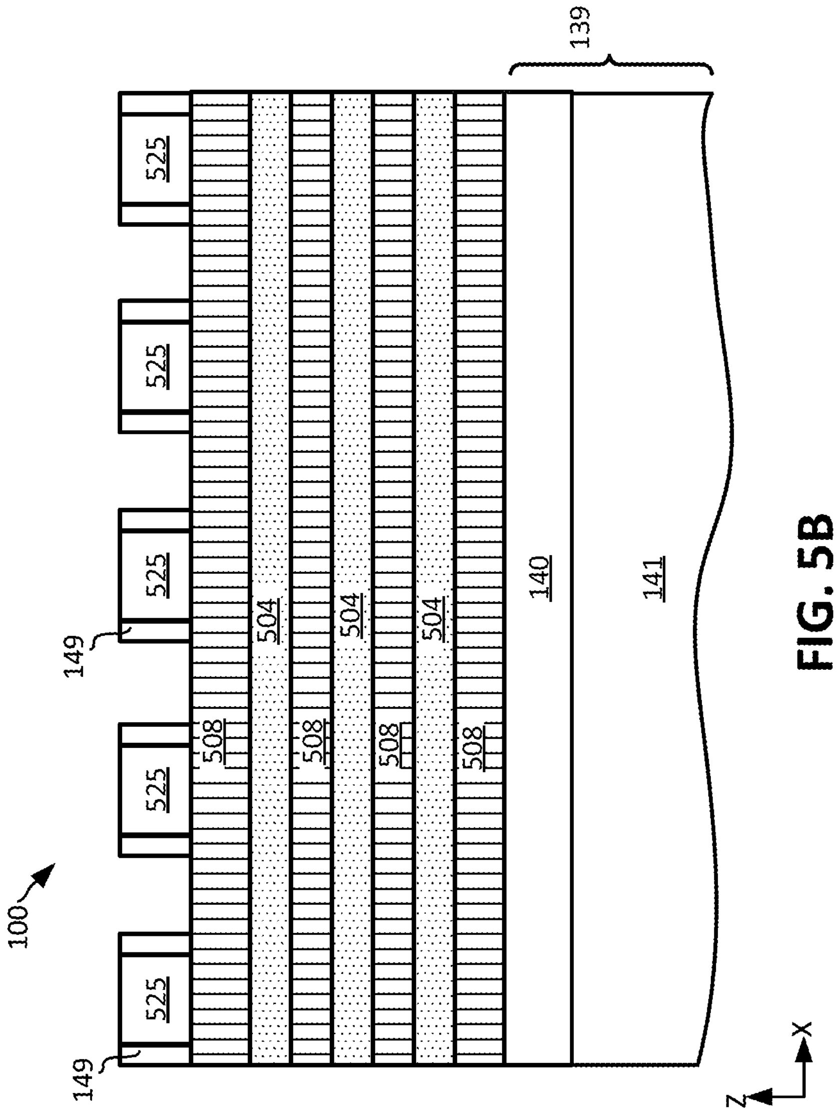

Referring to FIG. 4, the method 400 includes, at 404, from frontside of the integrated circuit chip, forming a plurality of fins, where a fin 501 has alternating layers of channel material 504 and sacrificial material 508 over a corresponding sub-fin area 139, as illustrated in FIG. 5A. In an example, the sub-fin area 139 is doped (e.g., prior to forming and patterning the alternating layers of channel material 504 and sacrificial material 508) to form portions 140 and 141 therewithin. For example, for the doping scheme of FIG. 1B, the portion 141 is doped with p-type dopant, and the portion 140 is doped with n-type dopant.

To form the structure illustrated in FIG. 5A, in an example, appropriately doped portions 140, 141 are initially formed over a section of a wafer. For example, the doped portion 141 is formed, followed by formation of the doped portion 140 above the doped portion 141. However, in another example, undoped portions 141 and 140 are formed, and subsequently the portions 141 and 140 are appropriately doped. In yet another example, the doping of the portions 140, 141 may be performed even later during the process, e.g., subsequent to forming the stack of layers 504, 508. In any case, after formation of the portions 140, 141, a stack of the alternating layers of channel material 504 and sacrificial material 508 is formed. Subsequently, the stack of the alternating layers and the portions 140, 141 are patterned, to form the plurality of fins (e.g., each above a corresponding sub-fin area comprising corresponding portions 140, 141), including the illustrated fin 501 of FIG. 5A. In an example, the various layers of the fin may be formed using an appropriate deposition process, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In an example, the sacrificial material 508 may comprise a semiconductor material, such as SiGe, that is etch selective with respect to the channel material 504 (e.g., Si, or other appropriate semiconductor material, discussed above). For example, an etch process to remove the sacrificial material 508 may not substantially etch the channel material 504.

Note that while the diode structure 100 of FIG. 1A includes the portions 140, 141, the diode structures of FIGS. 1C-1E may not include one or both of the portions 140, 141. Accordingly, to form a diode structure of any of FIGS. 1C-1E, the corresponding portion may be omitted from the sub-fin 139 of FIG. 5A and/or may be removed later during backside polish and planarization process 424 described herein below.

Figure 5C:
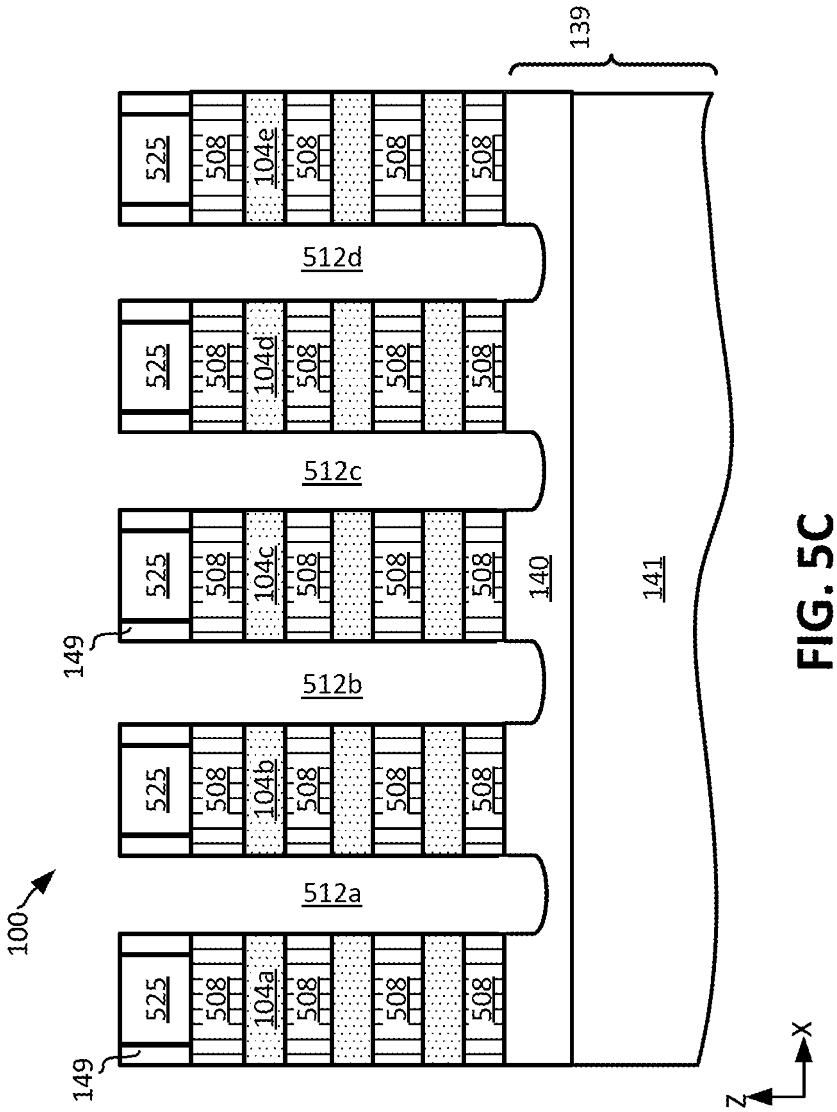

Referring again to FIG. 4, the method 400 then proceeds from 404 to 408, which includes forming dummy gate structures over the fin 501 (e.g., see FIG. 5B), and forming diffusion region trenches 512*a*, 512*b*, 512*c*, and 512*d* within the fin 501 (e.g., see FIG. 5C). In an example, each dummy gate structure comprises dummy gate oxide (not labelled in FIG. 5B), dummy gate electrode 525 (e.g., comprising polysilicon, for example), and gate spaces 149. In one embodiment, forming the dummy gate structure may include deposition of a dummy gate oxide, and deposition of a dummy gate electrode 525 (e.g., poly-Si). Gate spacers 149 are formed along opposite sides of the dummy gate electrode 525. For example, the gate spacers 149 comprise silicon nitride ($Si_3N_4$) and/or other suitable dielectric material, as will be appreciated. The dummy gates are formed in positions where the final metal gates are to be eventually formed for the diode structure 100.

Formation of the diffusion region trenches may be performed using an appropriate etch process. Note that as illustrated, each diffusion region trench 512 formation may also make an undercut in the portion 140 of the sub-fin 139, as illustrated, which facilitates better contact between the later formed diffusion regions 134 and the sub-fin 139. The various diffusion region trenches divide the fin 501 comprising the channel material 504 into multiple stacks comprising nanoribbons 104*a*, 104*b*, 104*c*, 104*d*, 104*e* of the structure 100, interleaved with the sacrificial material 508.

Figure 5D:
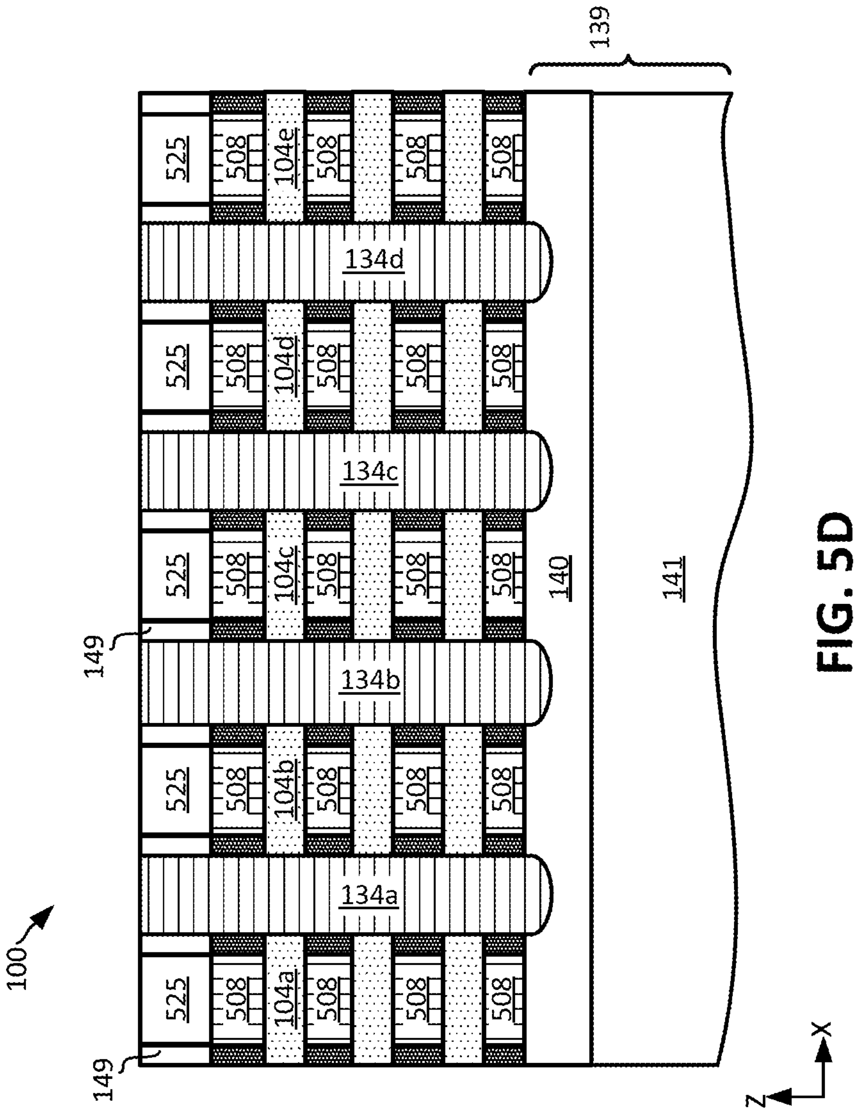

Referring again to FIG. 4, the method 400 then proceeds from 408 to 412, where inner gate spacers 145 are formed on sidewalls of the diffusion region trenches 512, and then various diffusion regions 134 of the structure 100 are formed, as illustrated in FIG. 5D. In an example, the inner gate spacers 145 may be formed using processes used to form such inner gate spacers in GAA transistors. For example, end portions of the sacrificial materials 508 of FIG. 5C are etched (e.g., using a wet etch that uses nitric acid/hydrofluoric acid, an anisotropic dry etch, or other suitable etch process) through the trenches 512*a*, 512*b*, 512*c*, 512*d*, to form corresponding recesses, and the inner gate spacers 145 are deposited using an appropriate deposition technique (e.g., CVD, PVD, ALD, VPE, MBE, or LPE, for example) within the thus formed recesses. The deposited inner gate spacers 145 may be planarized, such that tips of the channel materials 104 are exposed through the diffusion region trenches.

Subsequently, diffusion regions 134*a*, 134*b*, 134*c*, 134*d* are formed within the trenches 512*a*, 512*b*, 512*c*, 512*d*, respectively, e.g., as illustrated in FIG. 5D. In an example, the diffusion regions 134 are grown epitaxially within the corresponding trenches.

Figure 5E:
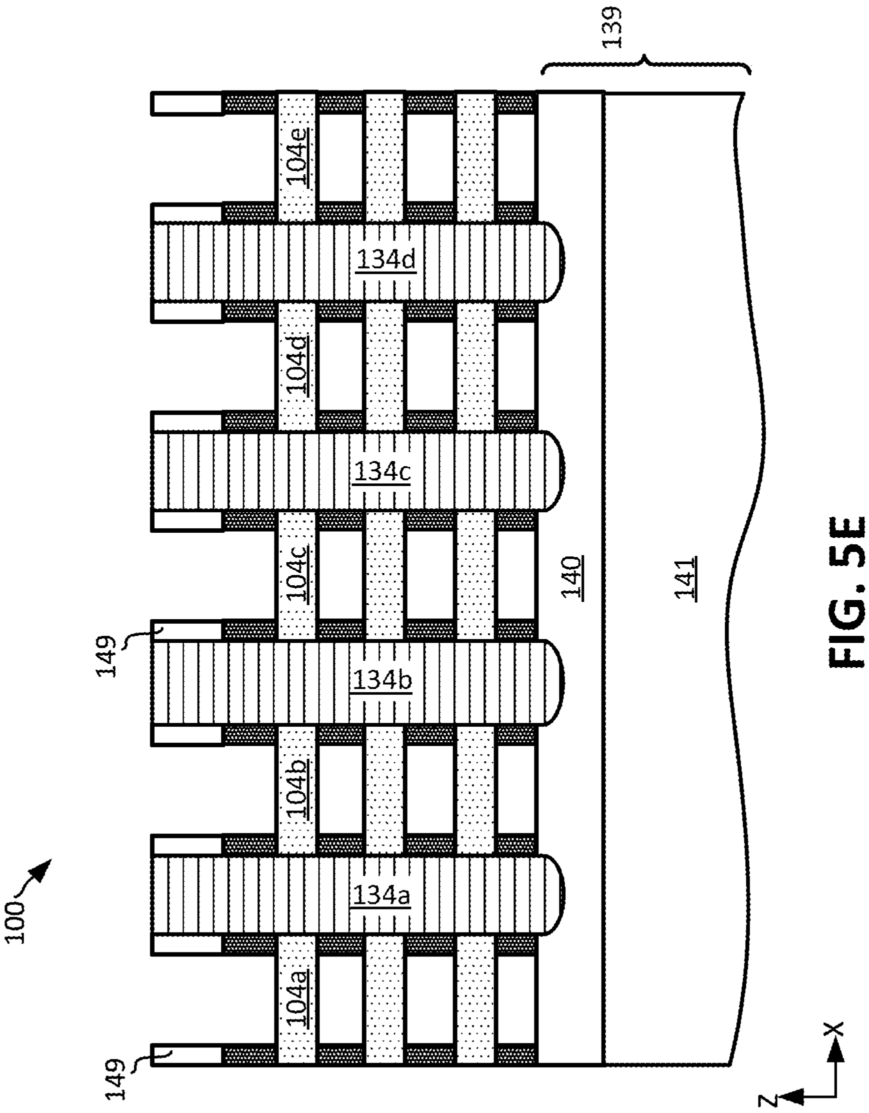

Referring again to FIG. 4, the method 400 then proceeds from 412 to 416, where the dummy gate structures are removed, and the nanoribbons 104 are released by removing the layers of sacrificial materials 508, as illustrated in FIG. 5E. In an example, the dummy gate materials (such as dummy gate dielectric and dummy gate electrodes 525) are removed via an etch process that is selective to the gate spacers 149 and inner gate spacers 145 and other non-gate materials exposed during channel and gate processing. Removing the dummy gate electrode between the gate spacers exposes the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the alternating layers of channel material and sacrificial material are exposed in the channel region.

The sacrificial material 508 in the layer stack can then be removed by etch processing, to release the nanoribbons 104, in accordance with some embodiments. Etching the sacrificial material 508 may be performed using any suitable wet or dry etching process such that the etch process selectively removes the sacrificial material and leaves intact the channel material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride (ClF3) etch is used to remove the sacrificial SiGe material. The etch chemistry can be selected based on the germanium concentration, nanoribbon dimensions, and other factors, as will be appreciated. After removing the SiGe sacrificial material, the resulting channel region includes silicon nanoribbons extending from corresponding diffusion region, where at least one end of each nanoribbon 104 (e.g., silicon) contacts a corresponding diffusion region.

Figure 5F:
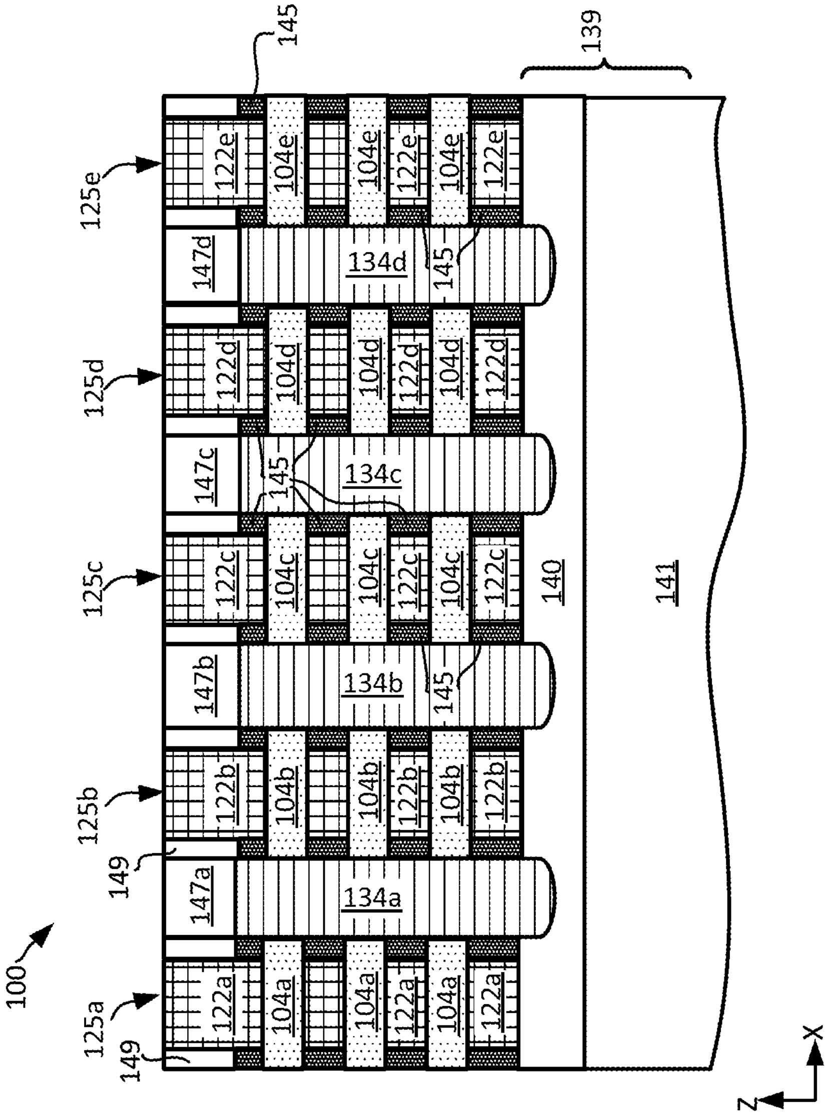

Referring again to FIG. 4, the method 400 then proceeds from 416 to 420, where the final gate structures 125 including gate electrodes 122 and gate dielectric 123 are formed, as illustrated in FIG. 5F, e.g., using processes for forming replacement gate structures in GAA devices. Also, various diffusion contacts are formed, as also illustrated in FIG. 5F. Note that the gate dielectric 123 is not separately labelled in FIG. 5F, and FIG. 5F shows the gate electrodes 122. However, the expanded view of a portion 119 of FIG. 1A illustrates and labels the gate dielectric 123.

Figure 5G:
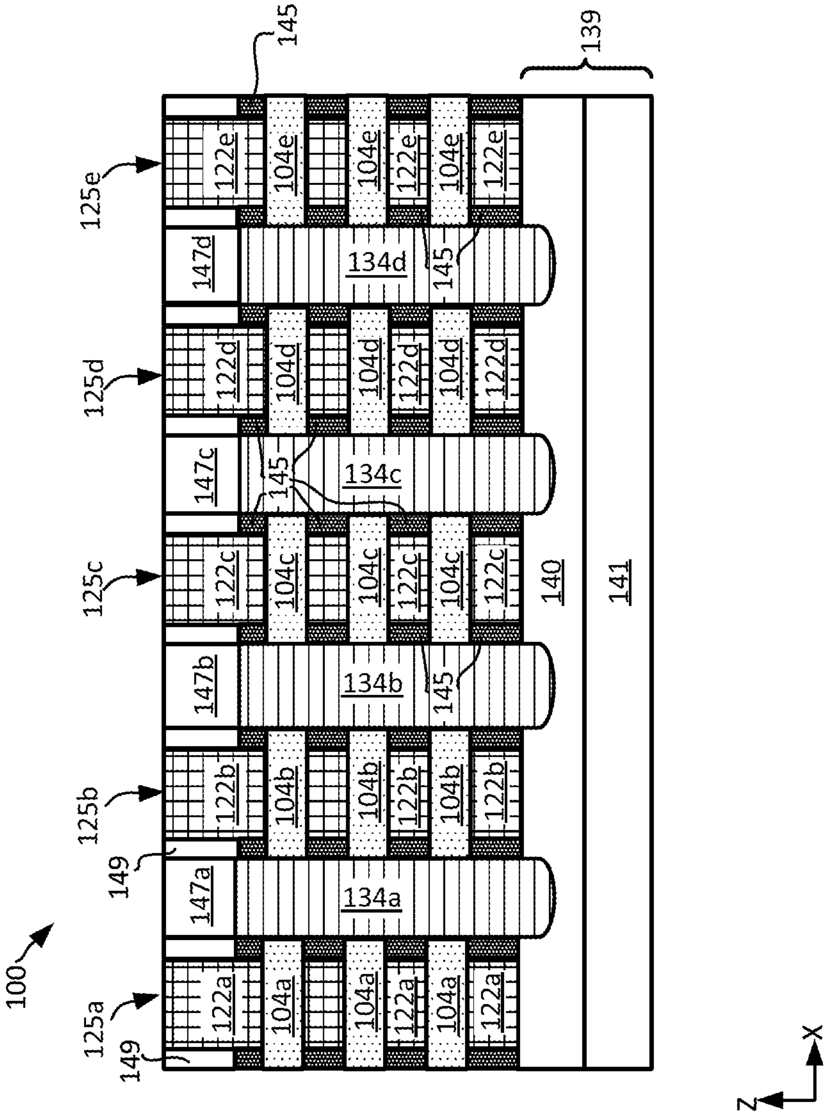

Referring again to the method 400 of FIG. 4, the method 400 proceeds from 420 to 424. At 424, from backside of the integrated circuit chip, the substrate is removed, to expose and planarize bottom surface of the portion 141 of the sub-fin 139, as illustrated in FIG. 5G. For example, the integrated circuit chip is flipped upside down (although the flipping is not illustrated in FIG. 5G, and the integrated circuit chip is shown in its original orientation), and the backside of the integrated circuit chip is processed from the top. Polishing the sub-fin may reduce the height of the sub-fin.

Referring again to the method 400 of FIG. 4, the method 400 proceeds from 424 to 428. At 428, from backside of the integrated circuit chip, the portion 142 of the sub-fin 139 is formed, as illustrated in the two example embodiments of FIGS. 5H1 and 5H2. FIGS. 5H1 and 5H2 illustrate two example processes of forming the portion 142 of the sub-fin 139.

In the example of FIG. 5H1, the portion 142 of the sub-fin 139 is formed by implanting dopants (e.g., p-type, for the example dopant scheme illustrated in FIG. 1B) within a bottom region of the portion 141, where the implantation occurs from the backside, as illustrated in FIG. 5H1. For example, portions 141 and 142 have the same type of dopants, with a dopant concentration of portion 142 being higher than that of portion 141. Thus, by implanting additional dopant in the bottom region of the portion 141, the bottom region of the portion 141 becomes heavily doped and transforms to the portion 142.

FIG. 5H2 illustrates another example process to form the heavily doped portion 142. For example, the heavily doped portion 142 is epitaxially formed below the portion 141 of the sub-fin 139. For example, the semiconductor material (e.g., silicon) of the portion 141 of the sub-fin 139 facilitates epitaxial growth of the heavily doped portion 142.

In an example, because portions 141 and 142 are formed using different processes in the example of FIG. 5H2, an interface, such as a seam or a grain boundary, may be formed between the portions 141, 142. In contrast, note that in an example, portions 140, 141 may be formed during a same process (although they may be doped different using different doping schemes employing different doping energy level, for example), and hence, no such seam or grain boundary may be formed between the portions 140, 141.

Figure 5I:
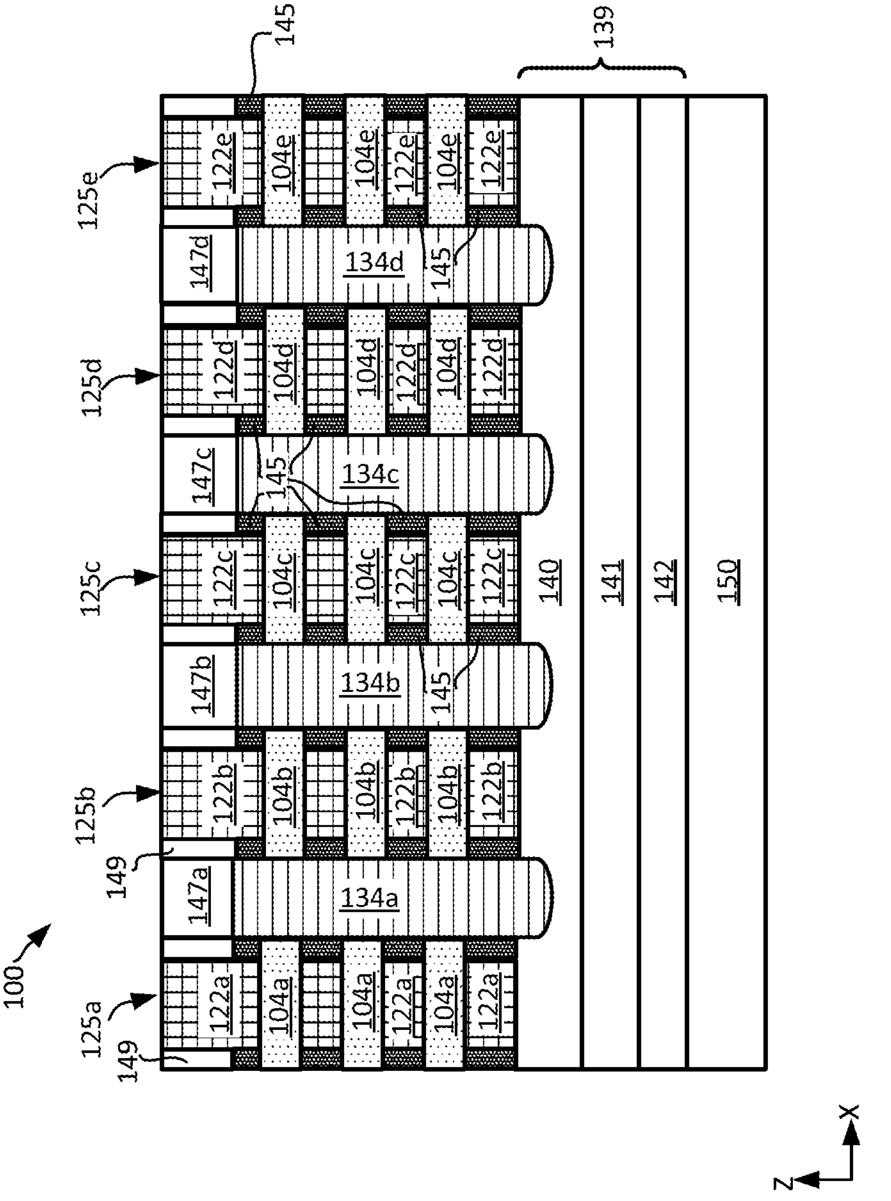

Referring again to the method 400 of FIG. 4, the method 400 proceeds from 428 to 432. At 432, from backside of the integrated circuit chip, the backside contact 150 is formed (e.g., using an appropriate deposition technique, such as electroplating, CVD, PVD, ALD, VPE, MBE, or LPE, for example), which is in contact with the portion 142 of the sub-fin 139, as illustrated in FIG. 5I.

The method 400 of FIG. 4 then proceeds from 432 to 436, where a general integrated circuit (IC) is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Figure 6:
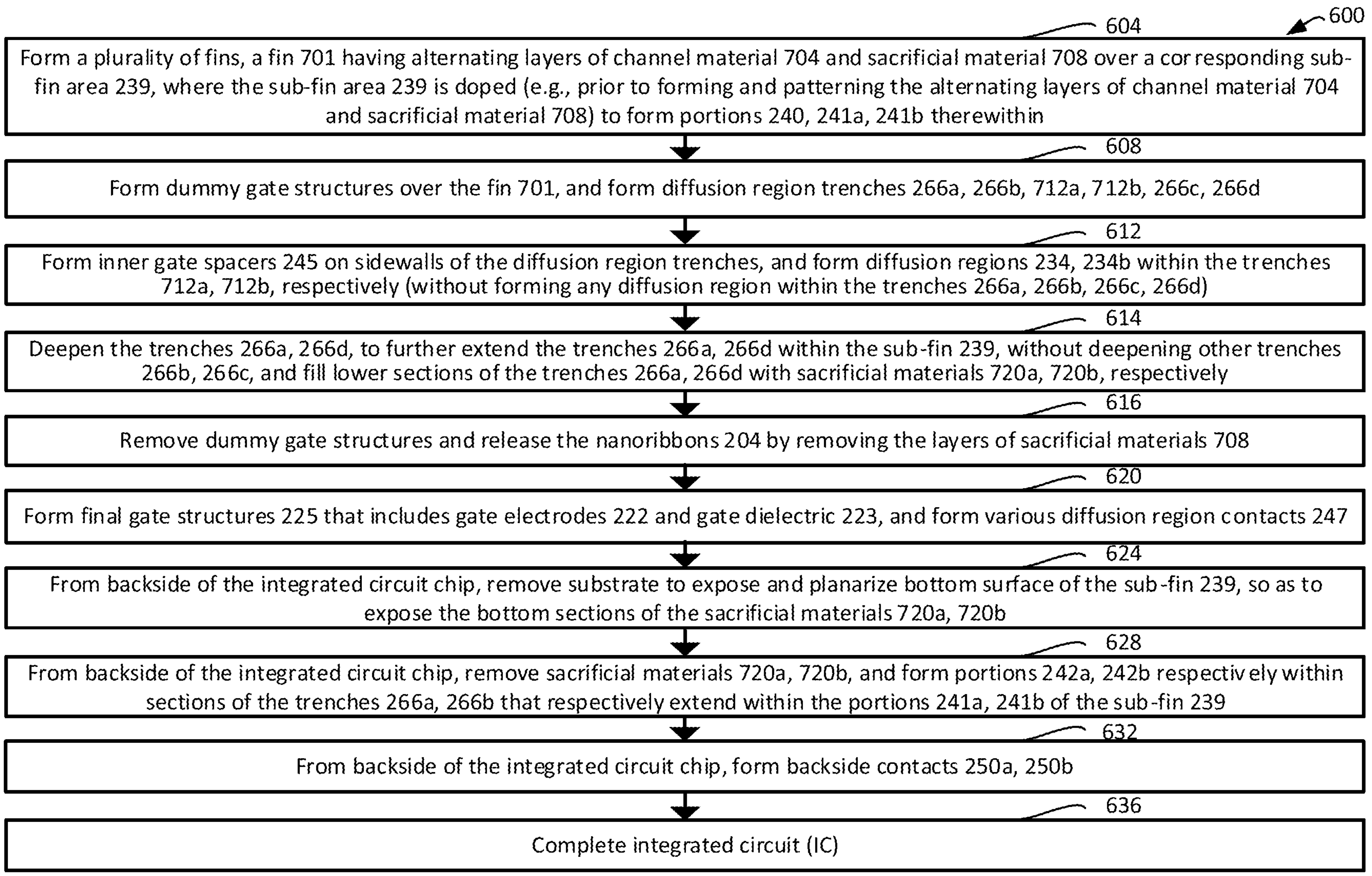
FIG. 6 illustrates a flowchart depicting a method of forming the diode structure of FIGS. 2-3, in accordance with an embodiment of the present disclosure.

FIG. 6 illustrates a flowchart depicting a method 600 of forming the diode structure 200 of FIGS. 2-3, in accordance with an embodiment of the present disclosure. FIGS. 7A, 7B, 7C, 7D, 7E, 7F, 7G, 7H, 7I, 7J, 7K, and 7L collectively illustrate cross-sectional views of a diode structure in various stages of processing in accordance with the methodology 600 of FIG. 6, in accordance with an embodiment of the present disclosure. FIGS. 6 and 7A-7L will be discussed in unison.

Figure 7A:
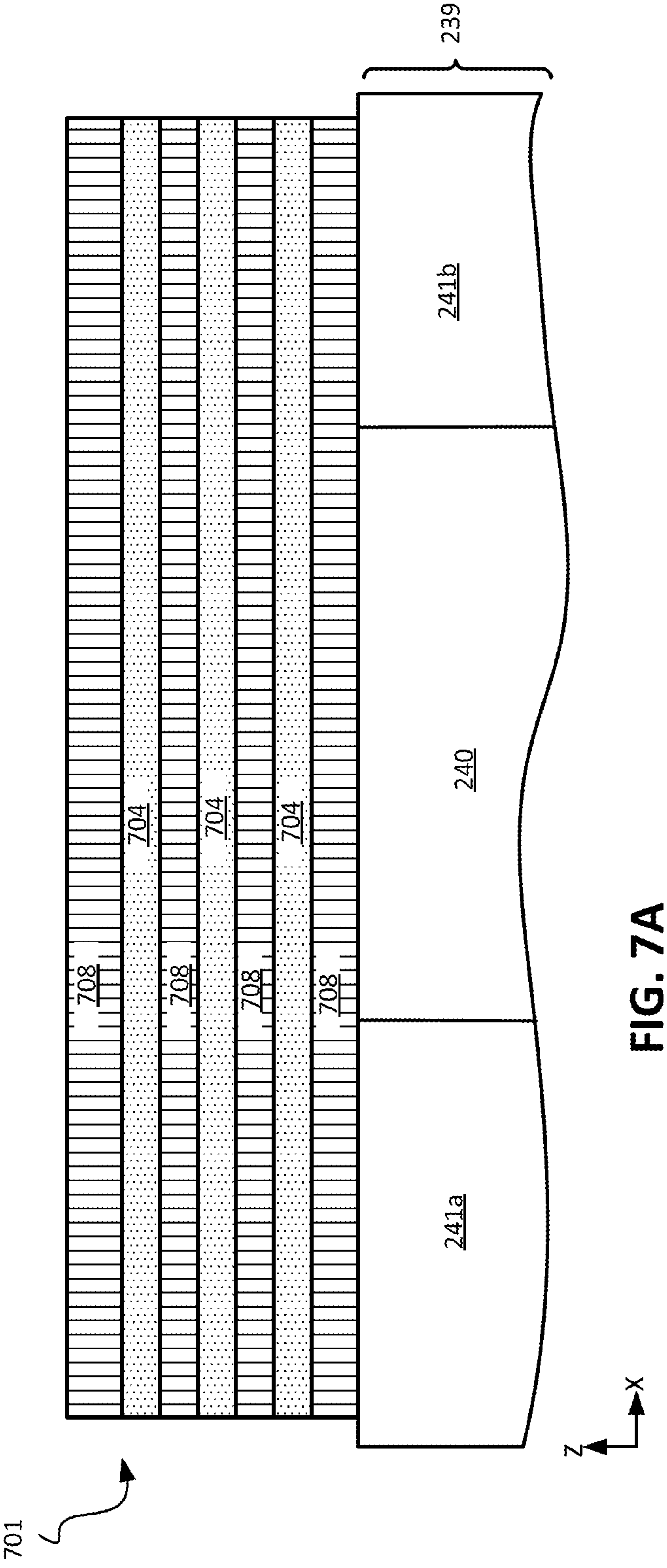
FIGS. 7A, 7B, 7C, 7D, 7E, 7F, 7G, 7H, 7I, 7J, 7K, and 7L collectively illustrate cross-sectional views of a diode structure in various stages of processing in accordance with the methodology of FIG. 6, in accordance with an embodiment of the present disclosure.
Figure 7B:
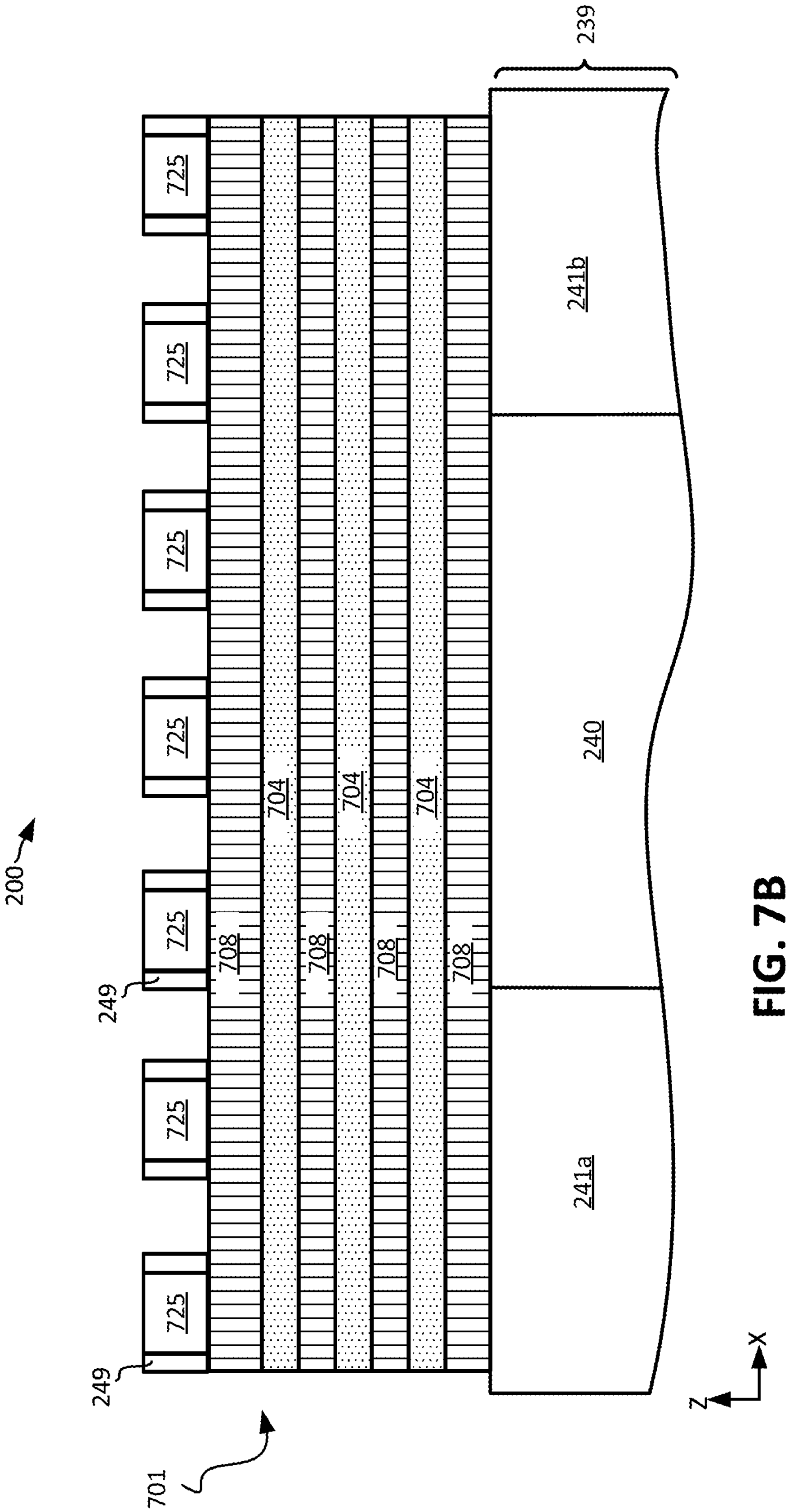

Referring to FIG. 6, the method 600 includes, at 604, from frontside of the integrated circuit chip, forming a plurality of fins, where a fin 701 has alternating layers of channel material 704 and sacrificial material 708 over a corresponding sub-fin area 239, as illustrated in FIG. 7A. In an example, the sub-fin area 239 is doped to form the portion 240 laterally between portions 241*a*, 241*b*, as illustrated in FIG. 7A. For example, for the doping scheme of FIG. 3, the portion 240 is doped with n-type dopant, and the portions 241*a*, 241*b* are doped with p-type dopant. The doping of various portions 241*a*, 240, 241*b* may be carried out at any appropriate stage during the process flow. For example, the portions 241*a*, 240, 241*b* may be doped (i) when forming the various portions, or (ii) after forming the sub-fin and prior to forming the alternating layers of channel material 704 and sacrificial material 708, or (iii) after forming the alternating layers of channel material 704 and sacrificial material 708, and may be implementation specific.

To form the structure illustrated in FIG. 7A, in an example, appropriately doped portions 240, 241 are initially formed over a section of a wafer. This is followed by formation of a stack of the alternating layers of channel material 704 and sacrificial material 708. Subsequently, the stack of the alternating layers and the portions 240, 241 are patterned, to form the plurality of fins (e.g., each above a corresponding sub-fin area 239 comprising corresponding portions 240, 241), including the illustrated fin 701 of FIG. 7A. In an example, the various layers of the fin may be formed using an appropriate deposition process, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In an example, the sacrificial material 708 may comprise a semiconductor material, such as SiGe, that is etch selective with respect to the channel material 704 (e.g., Si, or other appropriate semiconductor material, discussed above). For example, an etch process to remove the sacrificial material 708 may not substantially etch the channel material 704.

Figure 7C:
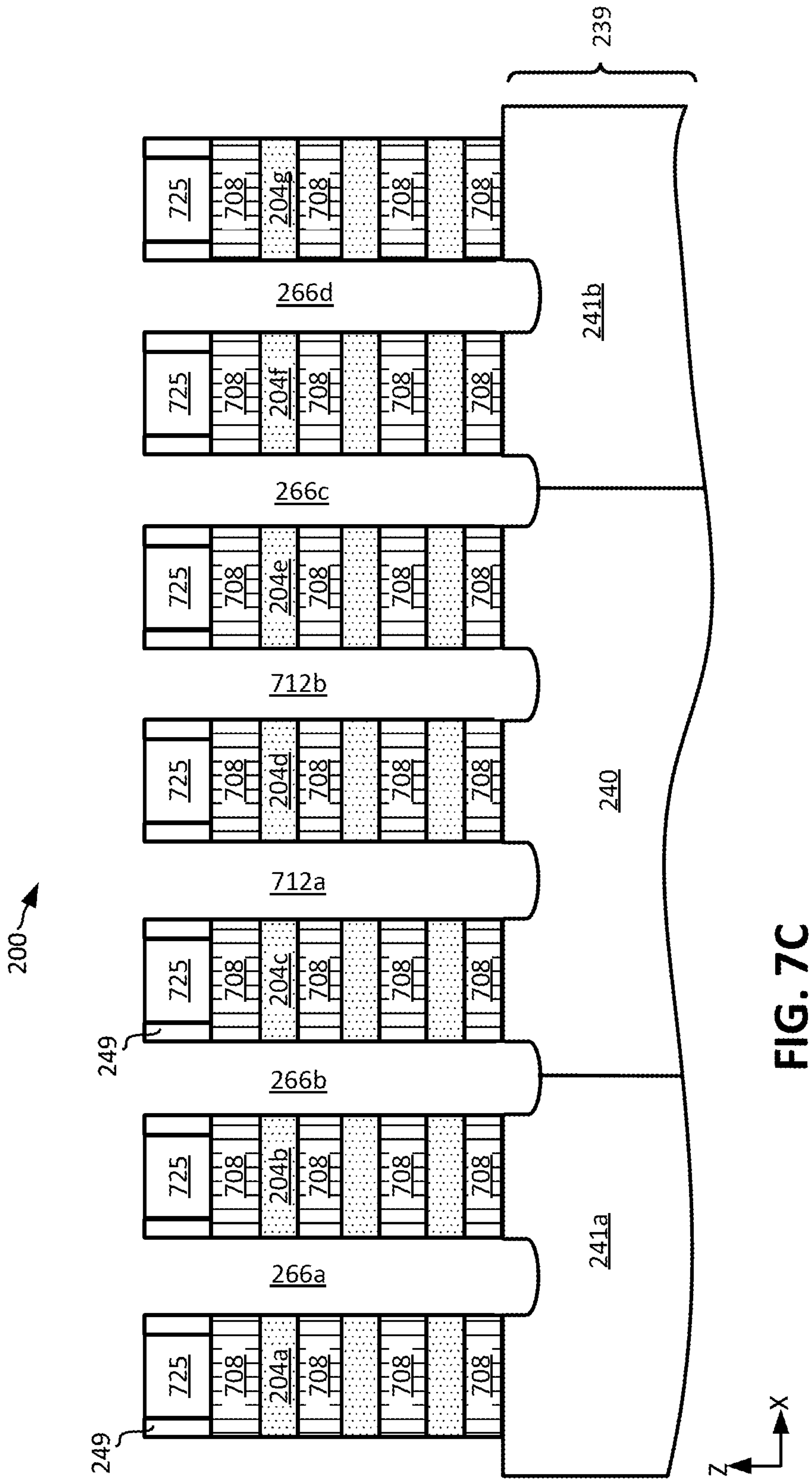

Referring again to FIG. 6, the method 600 then proceeds from 604 to 608, which includes forming dummy gate structures over the fin 701 (e.g., see FIG. 7B), and forming diffusion region trenches 266*a*, 266*b*, 712*a*, 712*b*, 266*c*, 266*d* within the fin 701 (e.g., see FIG. 7C). In an example, each dummy gate structure comprises dummy gate oxide (not labelled in FIG. 7B), dummy gate electrode 725 (e.g., comprising polysilicon, for example), and gate spaces 249. In one embodiment, forming the dummy gate structure may include deposition of a dummy gate oxide, and deposition of a dummy gate electrode 725 (e.g., poly-Si). Gate spacers 249 are formed along opposite sides of the dummy gate electrode 725. For example, the gate spacers 249 comprise silicon nitride ($Si_3N_4$) and/or other suitable dielectric material, as will be appreciated. The dummy gates are formed in positions where the final metal gates are to be eventually formed for the diode structure 200.

Formation of the diffusion region trenches may be performed using an appropriate etch process. Note that as illustrated, individual the diffusion region trench may also make an undercut in the sub-fin 239, as illustrated, which facilitates better contact between the later formed diffusion regions 234 and the sub-in 239. The various diffusion region trenches divide the stack of channel material 704 into multiple stacks comprising nanoribbons 204*a*, 204*b*, 204*c*, 204*d*, 204*e*, 204*f*, 204*g* of the structure 200, nanoribbon of each stack interleaved with the corresponding sacrificial material 508.

Figure 7D:
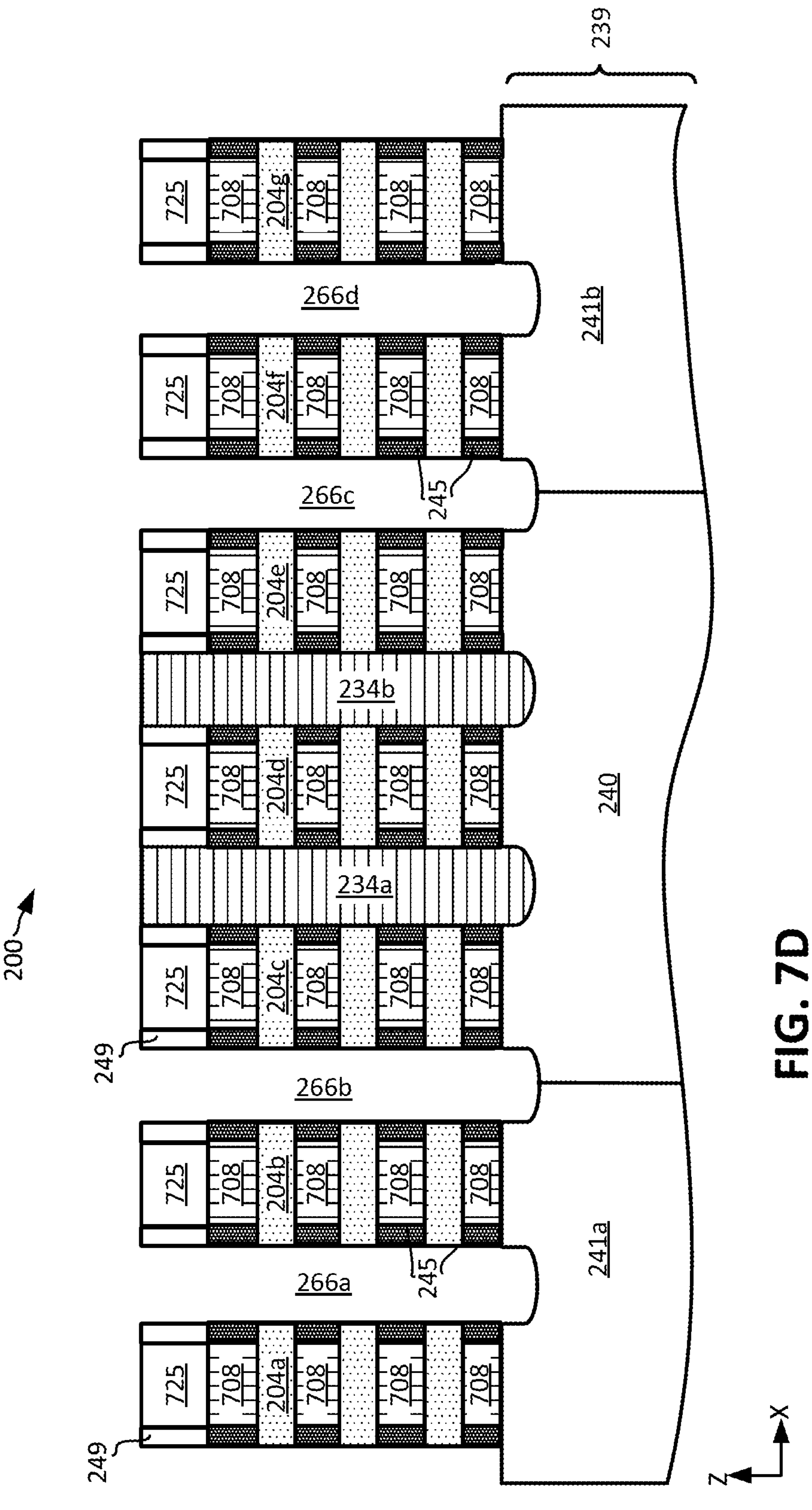

Referring again to FIG. 6, the method 600 then proceeds from 608 to 612, where inner gate spacers 245 are formed on sidewalls of the various diffusion region trenches, and then diffusion regions 234, 234*b* are formed within the diffusion region trenches 712*a*, 712*b*, respectively (e.g., without forming any diffusion region within the diffusion region trenches 266*a*, 266*b*, 266*c*, 266*d*), as illustrated in FIG. 7D. In an example, the inner gate spacers 245 may be formed using processes used to form such inner gate spacers in GAA transistors. For example, end portions of the sacrificial materials 708 of FIG. 7C are etched (e.g., using a wet etch that uses nitric acid/hydrofluoric acid, an anisotropic dry etch, or other suitable etch process) through the trenches 266*a*, 266*b*, 712*a*, 712*b*, 266*c*, 266*d*, to form corresponding recesses, and the inner gate spacers 245 are deposited using an appropriate deposition technique (e.g., CVD, PVD, ALD, VPE, MBE, or LPE, for example) within the thus formed recesses. The deposited inner gate spacers 245 may be planarized, such that tips of the channel materials 204 are exposed through the diffusion region trenches.

Subsequently, diffusion regions 234*a*, 234*b* are formed within the trenches 712*a*, 712*b*, respectively, e.g., as illustrated in FIG. 7D. In an example, the diffusion regions 234 are formed epitaxially within the corresponding trenches.

As illustrated, no diffusion regions are formed within the trenches 266*a*, 266*b*, 266*c*, 266*d*. For examples, these tranches are covered with one or more mask (e.g., a hard mask, such as a carbon hard mask) when forming the diffusion regions 234*a*, 234*b* with the corresponding trenches 712*a*, 712*b*, respectively. The masks are then removed.

Figure 7E:
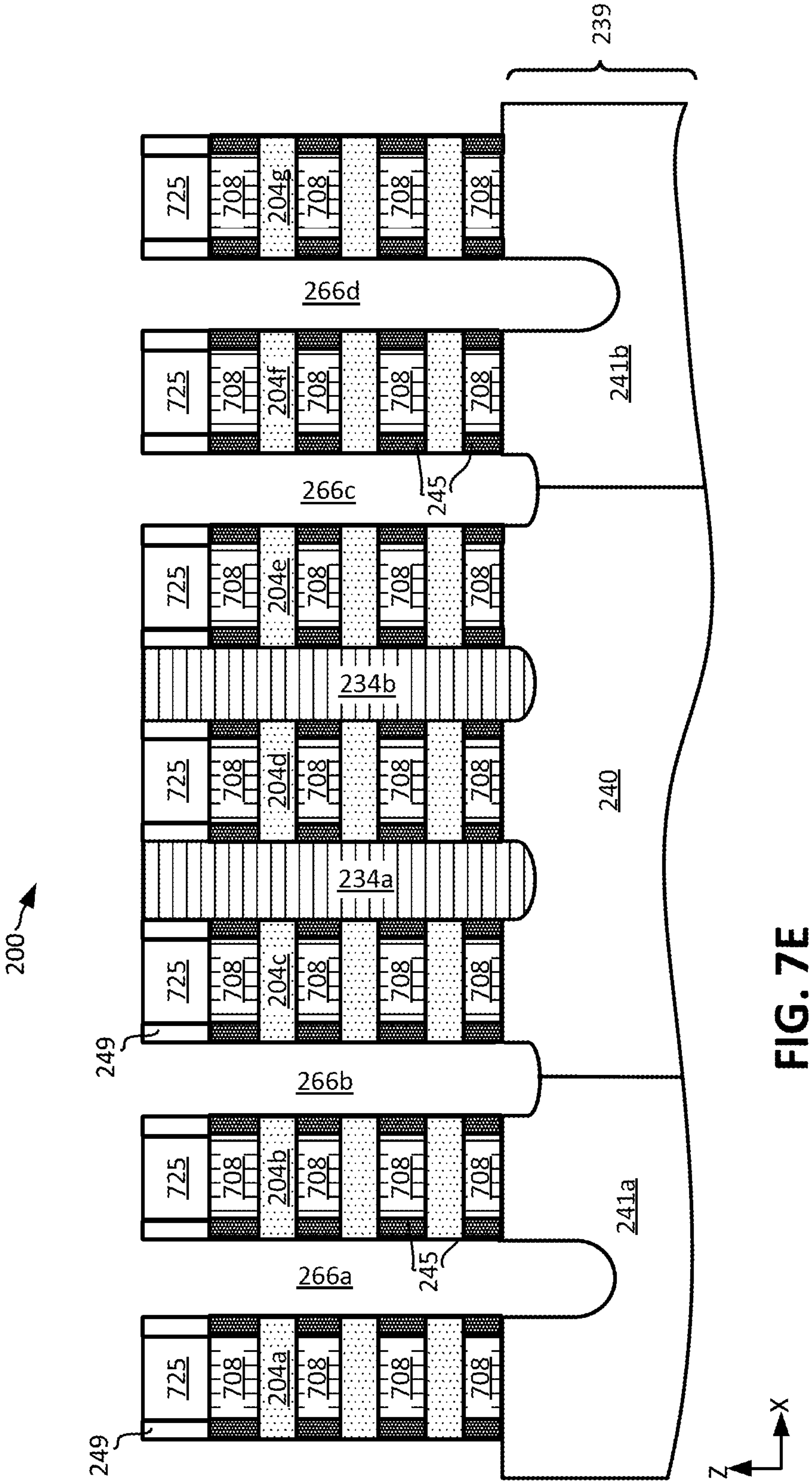
Figure 7F:
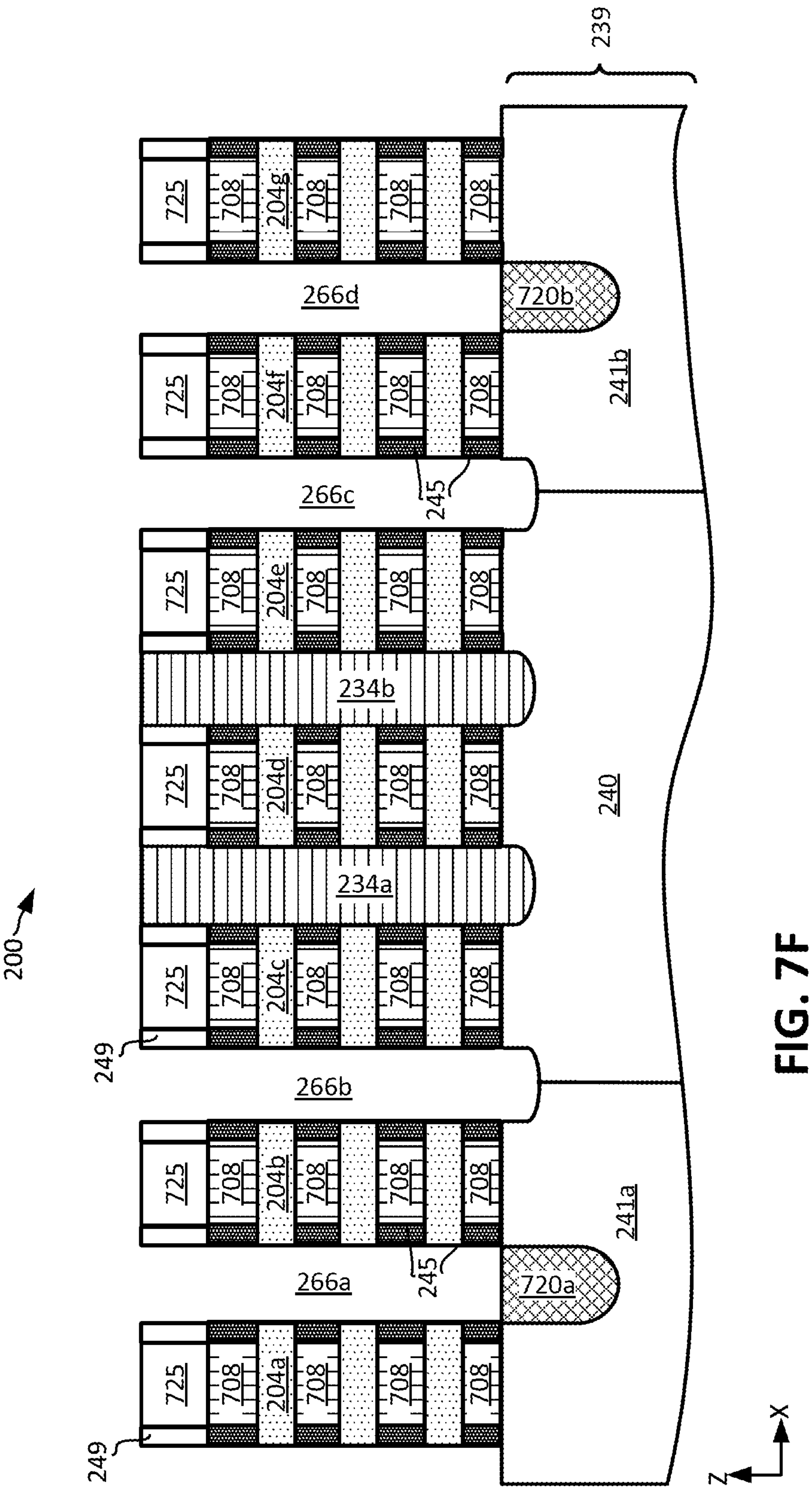

Referring again to FIG. 6, the method 600 then proceeds from 612 to 614, where the trenches 266*a*, 266*d* are further deepened, to further extend the trenches 266*a*, 266*d* within the sub-fin 239, e.g., without deepening other trenches 266*b*, 266*c*, as illustrated in FIG. 7E. Subsequently, lower portions of the trenches 266*a*, 266*d* (e.g., which extend within the portion 241*a*, 241*b*, respectively, of the sub-fin 239) are filled with sacrificial materials 720*a*, 720*b*, respectively, as illustrated in FIG. 7F. In an example, the deepening of the trenches 266*a*, 266*d* are performed using an appropriate etching process. It may be noted that the deepened trenches 266*a*, 266*b* may extend within, but not extend entirely through, the sub-fin 239, as illustrated in FIG. 7E. In an example, when the trenches 266*a*, 266*d* are being deepened, the trenches 266*b*, 266*c* may be covered with a mask (e.g., a hard mask, such as a carbon hard mask), to prevent deepening of the trenches 266*b*, 266*c*. The mask is then removed. In an example, the sacrificial materials 720*a*, 720*b* may be deposited using an appropriate deposition technique, such as CVD, PVD, ALD, VPE, MBE, or LPE, for example.

Figure 7G:
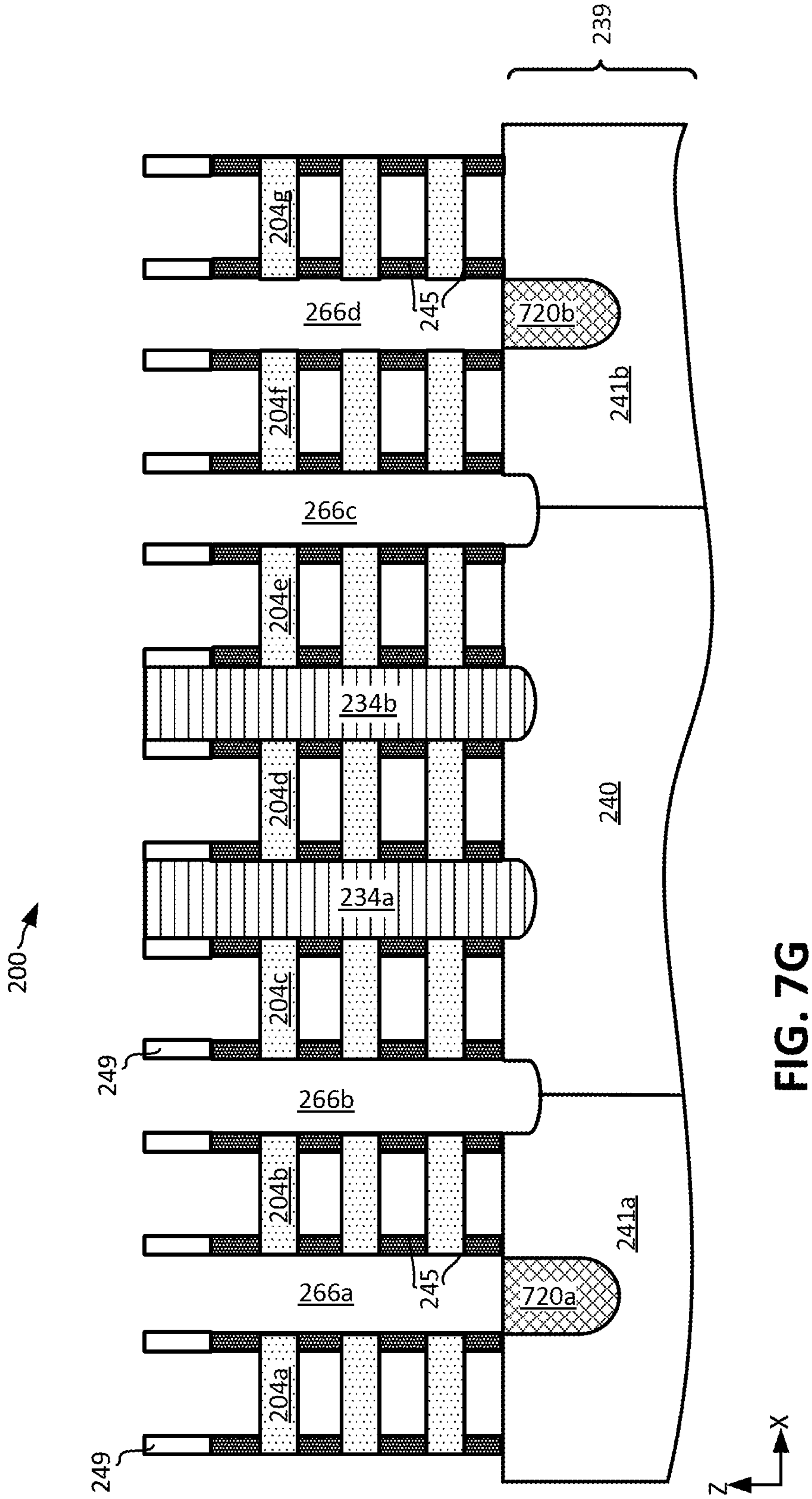

Referring again to FIG. 6, the method 600 then proceeds from 614 to 616, where the dummy gate structures are removed, and the nanoribbons 204 are released by removing the layers of sacrificial materials 708, as illustrated in FIG. 7G. In an example, the dummy gate materials (such as dummy gate dielectric and dummy gate electrodes 725) are removed via an etch process that is selective to the gate spacers 249 and inner gate spacers 245 and other non-gate materials exposed during channel and gate processing. Removing the dummy gate electrode between the gate spacers exposes the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the alternating layers of channel material and sacrificial material are exposed in the channel region.

The sacrificial material 708 can then be removed by etch processing, to release the nanoribbons 204, in accordance with some embodiments. Etching the sacrificial material 708 may be performed using any suitable wet or dry etching process such that the etch process selectively removes the sacrificial material and leaves intact the channel material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride (ClF3) etch is used to remove the sacrificial SiGe material. The etch chemistry can be selected based on the germanium concentration, nanoribbon dimensions, and other factors, as will be appreciated. After removing the SiGe sacrificial material, the resulting channel region includes silicon nanoribbons extending from corresponding diffusion region, where at least one end of each nanoribbon 204 (e.g., silicon) contacts a corresponding diffusion region.

Figure 7H:
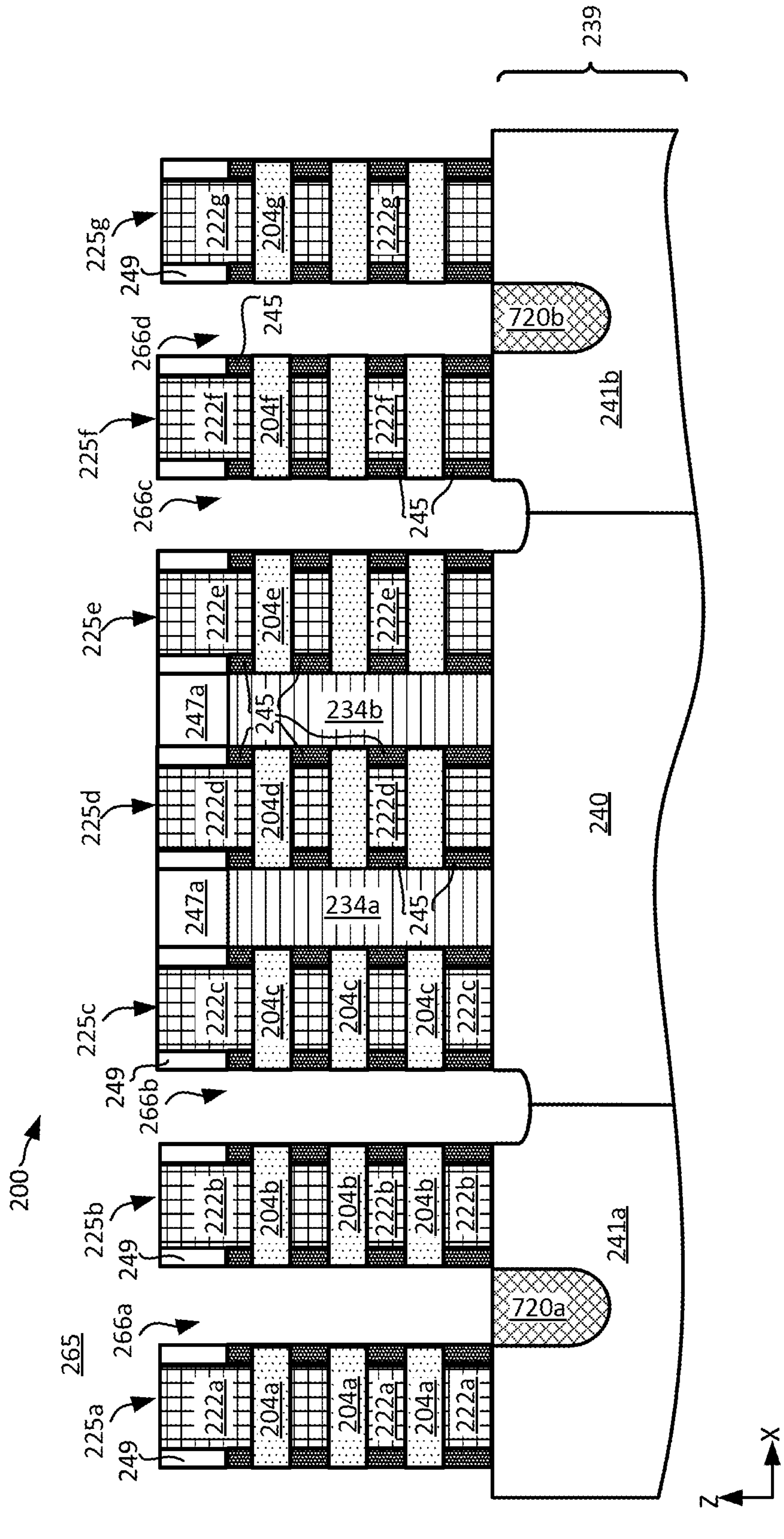

Referring again to FIG. 6, the method 600 then proceeds from 616 to 620, where the final gate structures 225 including gate electrodes 222 and gate dielectric 223 are formed, as illustrated in FIG. 7H, e.g., using processes for forming replacement gate structures in GAA devices. Also, various diffusion contacts are formed, as also illustrated in FIG. 7H. Note that the gate dielectric 223 is not separately labelled in FIG. 7H, and FIG. 7H shows the gate electrodes 122. However, the expanded view of a portion 219 of FIG. 2 illustrates and labels the gate dielectric 223.

Figure 7I:
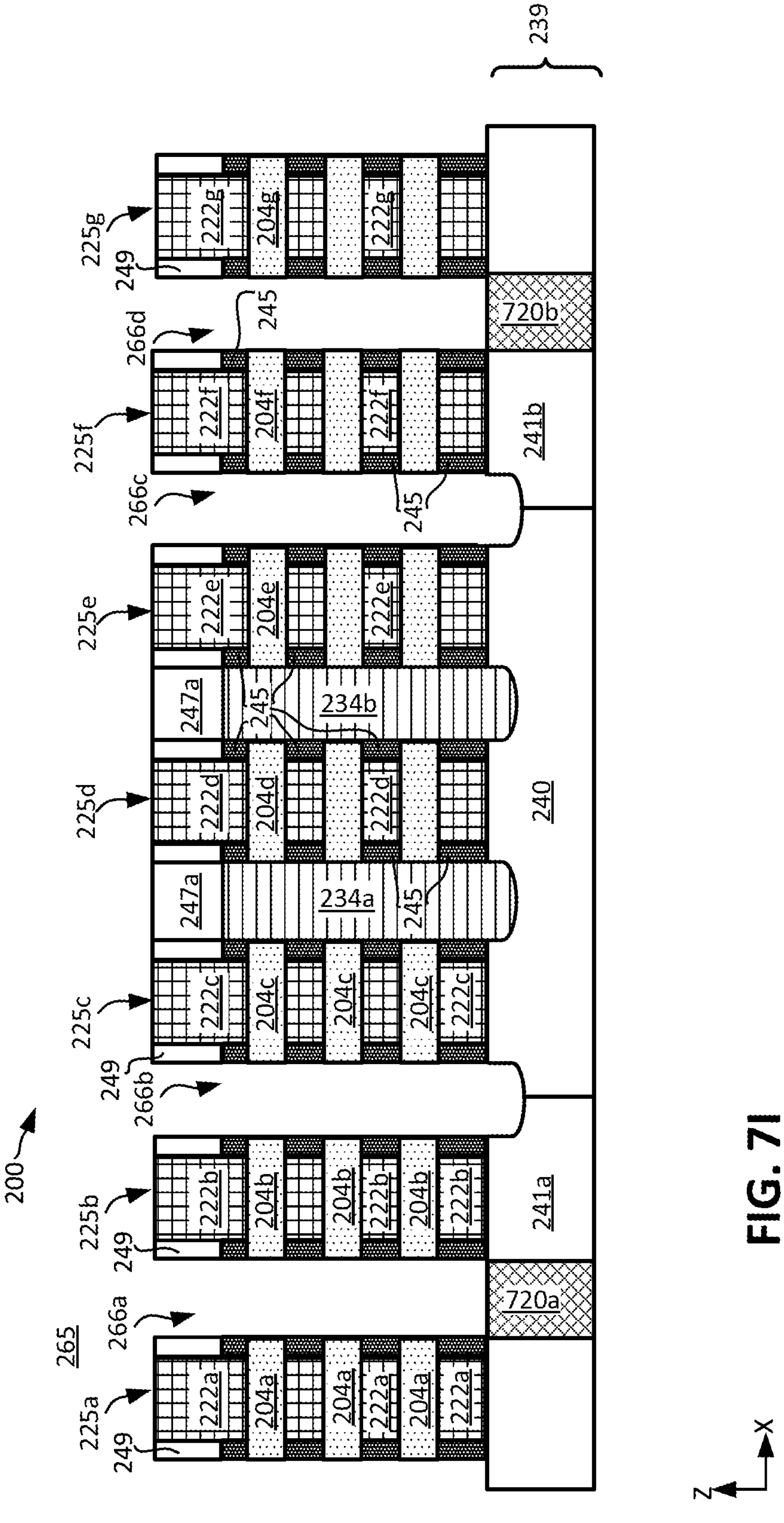
Figure 7J:
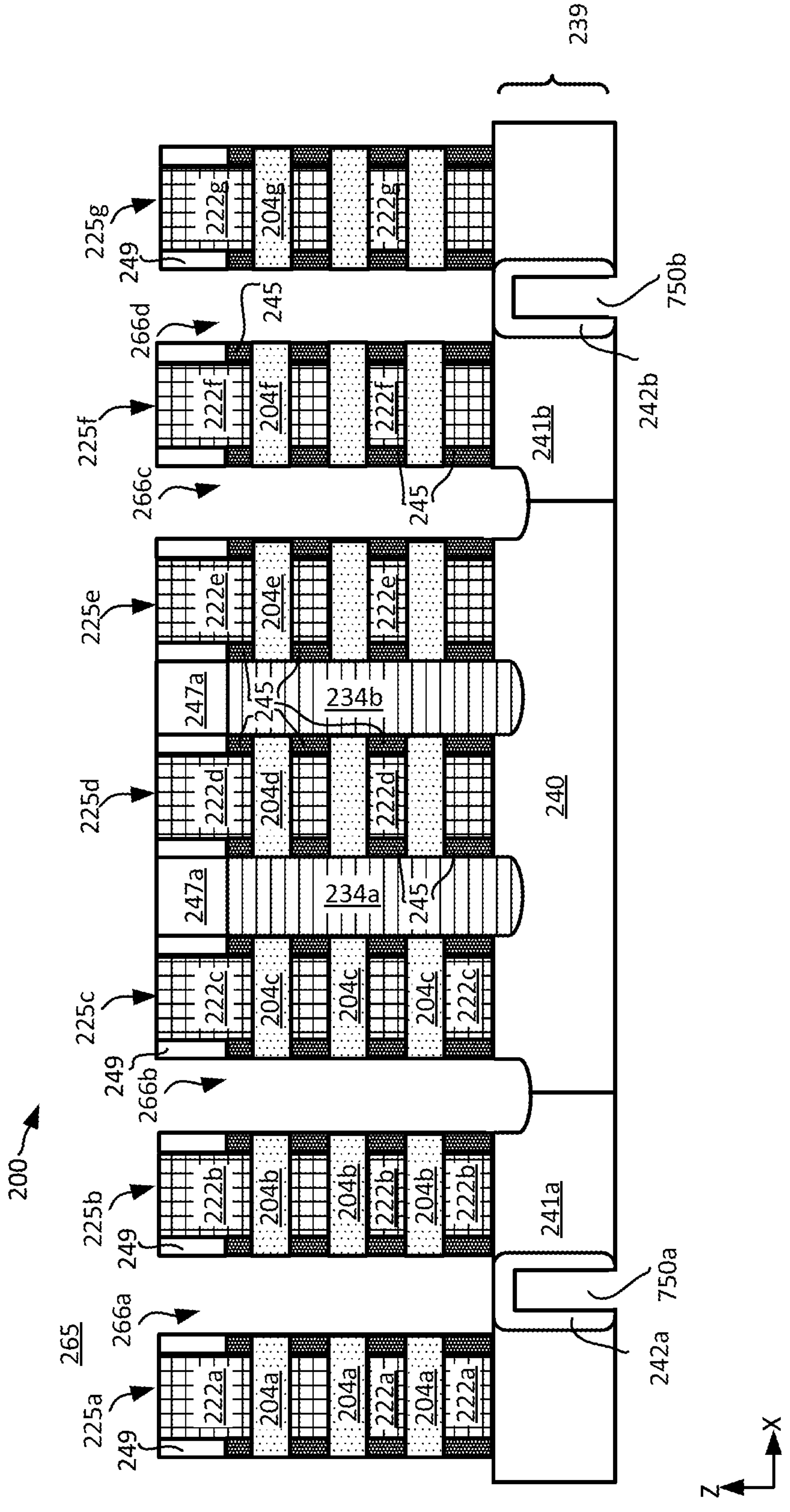

Referring again to FIG. 6, the method 600 proceeds from 620 to 624. At 624, from backside of the integrated circuit chip, the substrate is removed, to expose and planarize bottom surface of the sub-fin 239, so as to expose the bottom sections of the sacrificial materials 720*a*, 720*b*, as illustrated in FIG. 7I. For example, the integrated circuit chip is flipped upside down (although the flipping is not illustrated in FIG. 7I, and the integrated circuit chip is shown in its original orientation), and the backside of the integrated circuit chip is processed from the top. Polishing the sub-fin may reduce the height of the sub-fin.

Referring again to the method 600 of FIG. 6, the method 600 proceeds from 624 to 628. At 628, from backside of the integrated circuit chip, sacrificial materials 720*a*, 720*b* are removed, and portions 242*a*, 242*b* are respectively formed within sections of the trenches 266*a*, 266*b* that respectively extend within the portions 241*a*, 241*b* of the sub-fin 239. For example, the sacrificial materials 720*a*, 720*b* are removed using a selective etch process that removes the sacrificial materials 720*a*, 720*b*, without substantially removing the sub-fin 239 or other components of the structure 200.

After the sacrificial materials 720*a*, 720*b* are removed, semiconductor material of the portions 242*a*, 242*b* are formed (e.g., epitaxially grown) within the sections of the trenches 266*a*, 266*b* that respectively extend within the portions 241*a*, 241*b* of the sub-fin 239. Note that each portion 242 is grown to not fully cover the corresponding section of the trench 266 that extends within the sub-fin 239, so as to preserve voids or space 750*a*, 750*b* for the contacts 250*a*, 250*b* within the portions 242*a*, 242*b*, respectively.

Note that in an example, the lower sections of the trenches 266*a*, 266*b* (that respectively extend within the portions 241*a*, 241*b* of the sub-fin 239) may be expanded (e.g., by an etch process) from the backside, before forming the portions 242*a*, 242*b*, e.g., so as to provide a bigger space to form the portions 242*a*, 242*b* and the respective contacts 250*a*, 250*b*. In another example, no such expansion of the lower sections of the trenches 266*a*, 266*b* is performed.

Figure 7K:
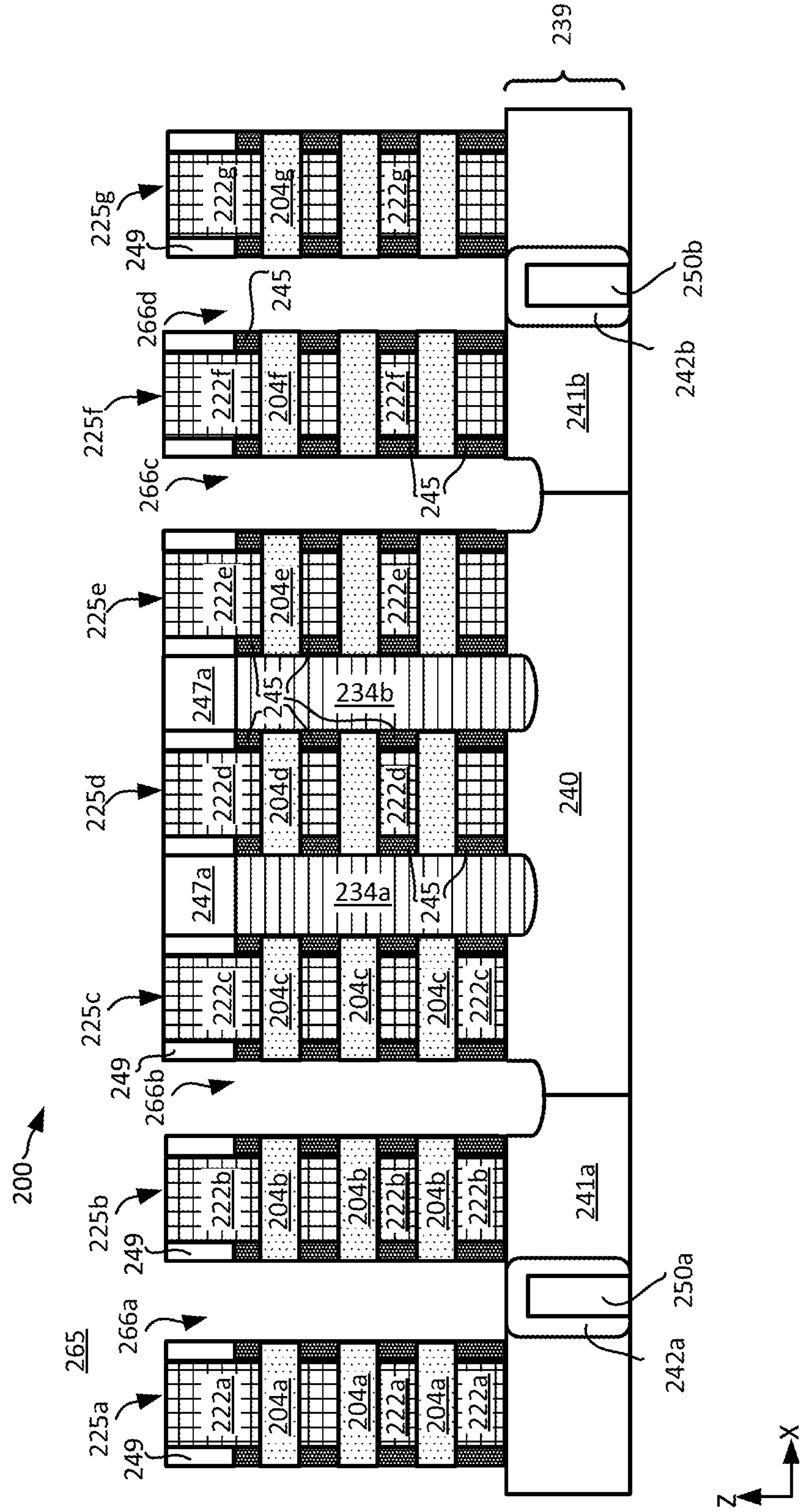
Figure 7L:
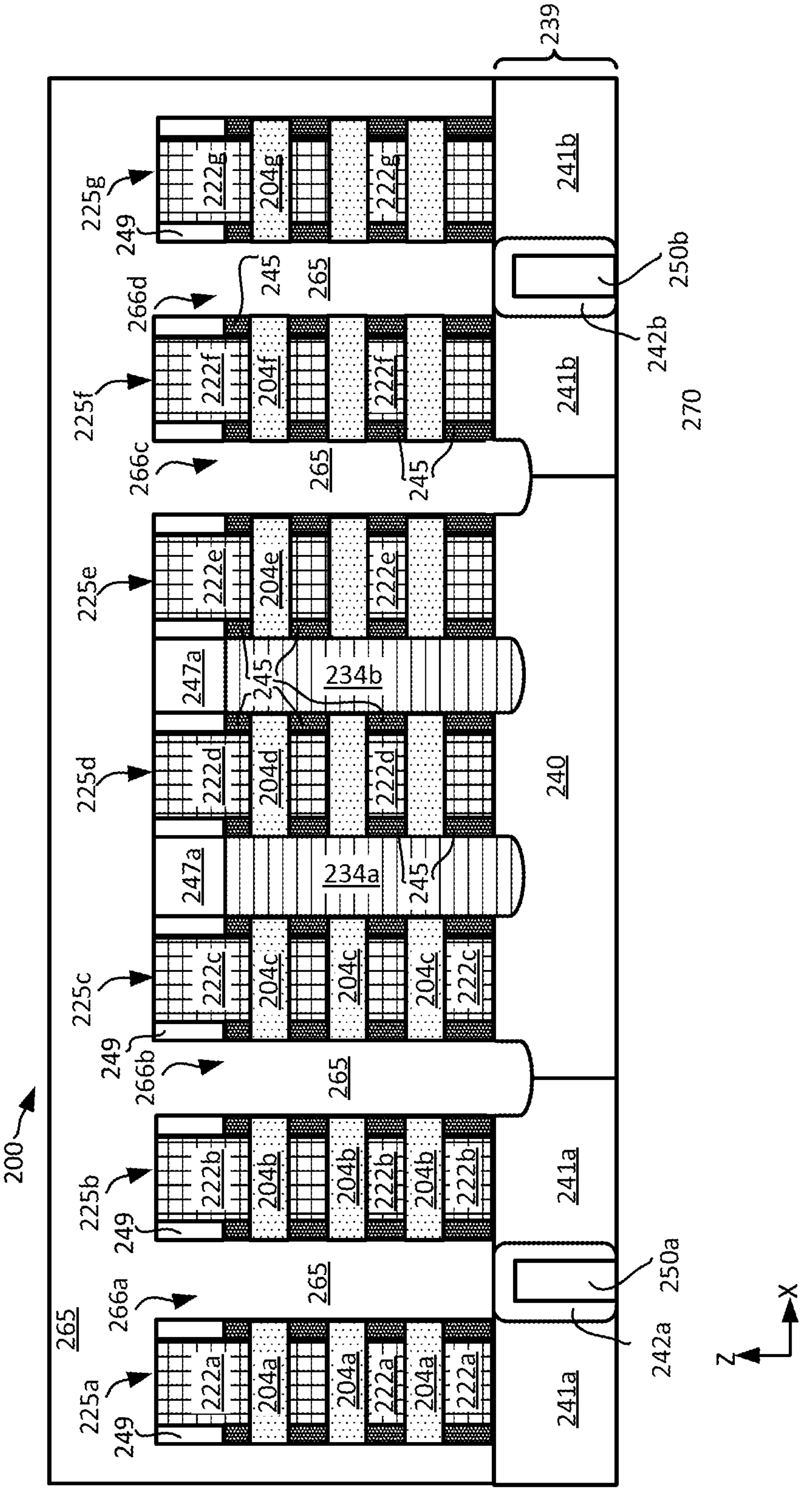

Referring again to FIG. 6, the method 600 proceeds from 628 to 632. At 632, from backside of the integrated circuit chip, the backside contacts 250*a*, 250*b* are formed, e.g., using an appropriate deposition technique, such as electroplating, CVD, PVD, ALD, VPE, MBE, or LPE, for example, as illustrated in FIG. 7K. For example, there were voids or space 750*a*, 750*b* within each of the portions 242*a*, 242*b*, and the contacts 250*a*, 250*b* are respectively formed within the voids or space 750*a*, 750*b*. Thus, the contacts 250*a*, 250*b* are respectively in contact with the portions 242*a*, 242*b* of the sub-fin 239.

The method 600 of FIG. 6 then proceeds from 632 to 636, where a general integrated circuit (IC) is completed, as desired, in accordance with some embodiments. Such additional processing to complete an IC may include depositing the dielectric material 265 on various components of the structure 200, back-end or back-end-of-line (BEOL) processing to form one or more metallization layers and/or to interconnect the transistor devices formed, for example. Any other suitable processing may be performed, as will be apparent in light of this disclosure.

Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Example System

Figure 8:
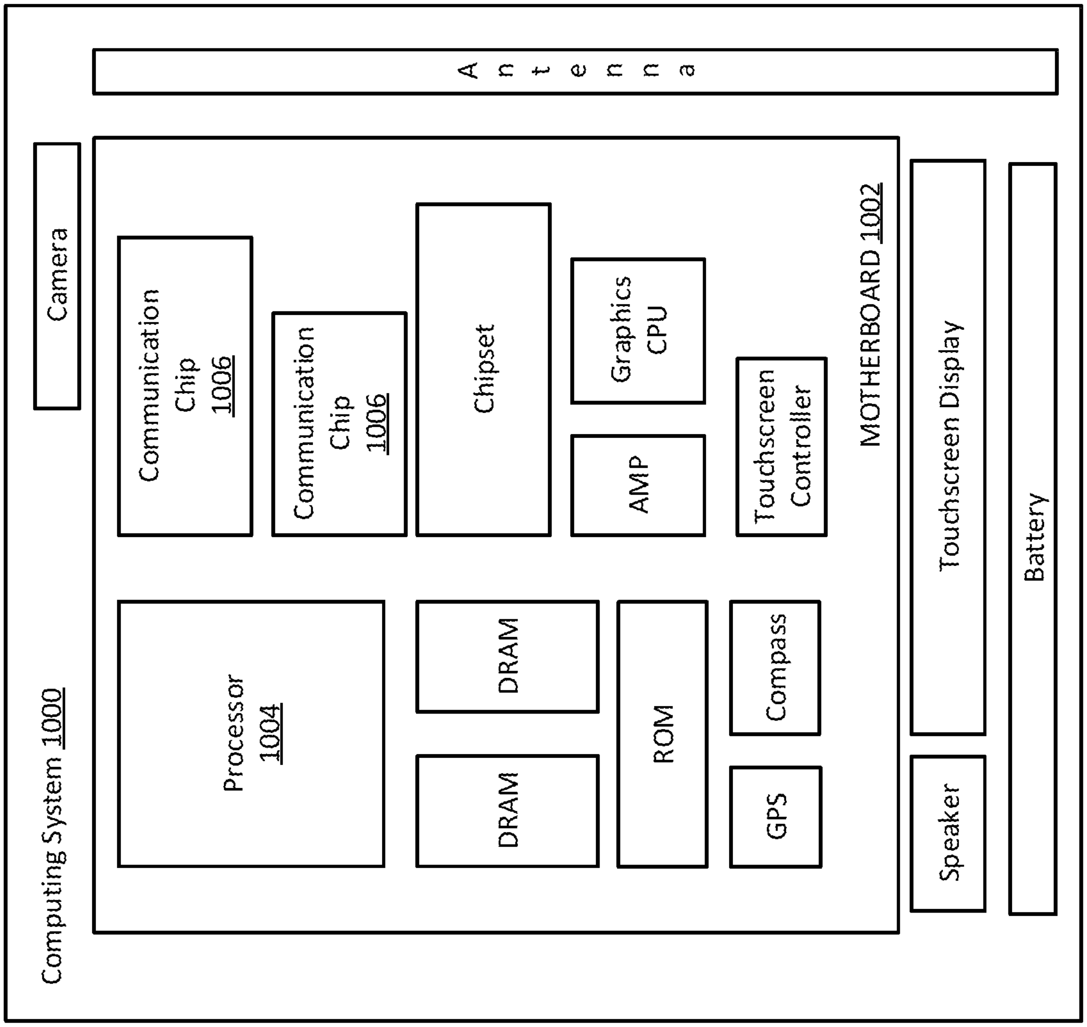
FIG. 8 illustrates a computing system implemented with integrated circuit structures (such as the diode structures illustrated in FIGS. 1A-3) formed using the techniques disclosed herein, in accordance with some embodiments of the present disclosure.

FIG. 8 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit structure comprising: a sub-fin having at least a portion that is doped with a first type of dopant; a diffusion region doped with a second type of dopant, the diffusion region in contact with the sub-fin and extending upward from the sub-fin, wherein the first type of dopant is one of a p-type or an n-type dopant, and wherein the second type of dopant is the other of the p-type or the n-type dopant; a first conductive contact above and on the diffusion region; and a second conductive contact in contact with the portion of the sub-fin.

Example 2. The integrated circuit structure of example 1, wherein the portion of the sub-fin is a first portion, and wherein the sub-fin further has a second portion between the diffusion region and the first portion of the sub-fin, the second portion doped differently from the first portion.

Example 3. The integrated circuit structure of example 2, wherein the first and second portions comprise semiconductor material, with an interface between the first and second portions.

Example 4. The integrated circuit structure of any one of examples 2-3, wherein the second portion comprises the first type of dopant, and wherein a dopant concentration of the first type of dopant within the first portion is at least twice a dopant concentration of the first type of dopant within the second portion.

Example 5. The integrated circuit structure of example 4, wherein: the sub-fin has a third portion comprising the second type of dopant; the third portion is between the diffusion region and the second portion; and the third portion is in contact with the second portion, to form a PN junction of a diode therebetween.

Example 6. The integrated circuit structure of example 5, wherein the diffusion region is in contact with the third portion of the sub-fin.

Example 7. The integrated circuit structure of any one of examples 5-6, wherein: the diffusion region is above and at least in part extends within the third portion of the sub-fin; the second portion is below the third portion; the first portion is below the second portion; and the second conductive contact is below the first portion.

Example 8. The integrated circuit structure of any one of examples 5-6, wherein: the diffusion region is above and at least in part extends within the third portion of the sub-fin; the second portion is laterally adjacent to the third portion; the first portion is laterally adjacent to the second portion; and the second conductive contact at least in part laterally adjacent to, extends within, the first portion.

Example 9. The integrated circuit structure of any one of examples 5-6 and 8, wherein: the diffusion region is a first diffusion region; the integrated circuit structure further comprises (i) a second diffusion region doped with the second type of dopant, the second diffusion region is above and at least in part extends within the third portion of the sub-fin, and (ii) a trench comprising dielectric material; the second diffusion region is laterally between the first diffusion region and the trench; and the trench at least in part extends within the sub-fin.

Example 10. The integrated circuit structure of example 9, wherein the trench is above the PN junction between the second and third portions.

Example 11. The integrated circuit structure of any one of examples 9-10, wherein the trench is a first trench, and wherein the integrated circuit structure further comprises a second trench comprising dielectric material in contact with the sub-fin, wherein the second trench is above the second conductive contact.

Example 12. The integrated circuit structure of any one of examples 3-11, wherein the dopant concentration of the first type of dopant within the first portion is at least two times or at least four times the dopant concentration of the first type of dopant within the second portion.

Example 13. The integrated circuit structure of any one of examples 1-12, wherein: the diffusion region is a first diffusion region; the integrated circuit structure further comprises (i) a second diffusion region doped with the second type of dopant, the second diffusion region in contact with the sub-fin and extending upward from the sub-fin, (ii) one or more bodies of semiconductor material extending from the first diffusion region to the second diffusion region, and (iii) a gate structure comprising a gate electrode and gate dielectric on the one or more bodies.

Example 14. The integrated circuit structure of any one of examples 1-13, wherein the one or more bodies comprise one or more nanoribbons, one or more nanosheets, one or more nanowires, or a fin.

Example 15. The integrated circuit structure of any one of examples 1-14, wherein the first conductive contact is one of an anode contact or a cathode contact of a diode, and the second conductive contact is the other of the anode contact or the cathode contact of the diode.

Example 16. The integrated circuit structure of any one of examples 1-15, wherein the diffusion region is at least a part of one of an anode or a cathode of a diode, and the portion of the sub-fin is at least a part of the other of the anode or the cathode of the diode.

Example 17. The integrated circuit structure of any one of examples 1-16, wherein the sub-fin is in between, and separates the second conductive contact from the diffusion region.

Example 18. A diode structure comprising: a sub-fin; a first conductive contact in contact with the sub-fin, wherein the first conductive contact is one of an anode contact or a cathode contact of the diode structure; a diffusion region in contact with the sub-fin; and a second conductive contact in contact with the diffusion region, wherein the second conductive contact is the other of the anode contact or the cathode contact of the diode structure.

Example 19. The diode structure of example 18, wherein: the sub-fin comprises (i) a first portion that is doped with a first type of dopant, and (ii) a second portion that is doped with a second type of dopant, wherein the first type of dopant is one of a p-type or an n-type dopant, and wherein the second type of dopant is the other of the p-type or the n-type dopant; the diffusion region doped with the second type of dopant; and the first portion and the second portion in contact with each other, to form a PN junction of the diode structure therebetween.

Example 20. The diode structure of any one of examples 18-19, wherein: the sub-fin further comprises a third portion that is doped with the first type of dopant, such that a doping concentration of the first type of dopant within the third portion is at least twice a doping concentration of the first type of dopant within the first portion; and the third portion is in contact with the second conductive contact.

Example 21. The diode structure of any one of examples 18-20, further comprising: one or more bodies of semiconductor material extending laterally from the diffusion region; and a gate structure comprising a gate electrode and gate dielectric on the one or more bodies.

Example 22. The diode structure of example 21, wherein the one or more bodies comprise one or more nanoribbons, one or more nanosheets, one or more nanowires, or a fin.

Example 23. An integrated circuit structure comprising: a sub-fin; a first diffusion region and a second diffusion region, each in contact with, and extending upward from, the sub-fin; one or more bodies of semiconductor material extending laterally from the first diffusion region to the second diffusion region; a gate structure comprising a gate electrode and gate dielectric on the one or more bodies; and a first conductive contact comprising metal in contact with the first diffusion region, a second conductive contact comprising metal in contact with the second diffusion region, and a third conductive contact comprising metal in contact with the sub-fin.

Example 24. The integrated circuit structure of example 23, wherein the one or more bodies of semiconductor material comprise one or more nanoribbons, one or more nanosheets, one or more nanowires, or a fin.

Example 25. The integrated circuit structure of any one of examples 23-24, wherein the first and second conductive contacts collectively form one of an anode contact or a cathode contact of a diode, and the third conductive contact forms the other of the anode contact or the cathode contact of the diode.

Example 26. The integrated circuit structure of any one of examples 23-25, wherein the first conductive contact and the second conductive contact are coupled to a same terminal.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure comprising:

a sub-fin having at least a first portion that is doped with a first type of dopant;

a diffusion region doped with a second type of dopant, the diffusion region in contact with the sub-fin and extending upward from the sub-fin, wherein the first type of dopant is one of a p-type or an n-type dopant, and wherein the second type of dopant is the other of the p-type or the n-type dopant, wherein the sub-fin further includes a second portion between the diffusion region and the first portion of the sub-fin, the second portion doped differently from the first portion;

a first conductive contact above and on the diffusion region; and a second conductive contact in contact with the portion of the sub-fin.

2. The integrated circuit structure of claim 1, wherein the first and second portions comprise semiconductor material, with an interface between the first and second portions.

3. The integrated circuit structure of claim 1, wherein the second portion comprises the first type of dopant, and wherein a dopant concentration of the first type of dopant within the first portion is at least twice a dopant concentration of the first type of dopant within the second portion.

4. The integrated circuit structure of claim 3, wherein:

the sub-fin has a third portion comprising the second type of dopant;

the third portion is between the diffusion region and the second portion; and the third portion is in contact with the second portion, to form a PN junction.

5. The integrated circuit structure of claim 4, wherein the diffusion region is in contact with the third portion of the sub-fin.

6. The integrated circuit structure of claim 4, wherein:

the diffusion region is above and at least in part extends within the third portion of the sub-fin;

the second portion is below the third portion;

the first portion is below the second portion; and the second conductive contact is below the first portion.

7. The integrated circuit structure of claim 4, wherein:

the diffusion region is above and at least in part extends within the third portion of the sub-fin;

the second portion is laterally adjacent to the third portion;

the first portion is laterally adjacent to the second portion; and the second conductive contact at least in part laterally adjacent to, extends within, the first portion.

8. The integrated circuit structure of claim 4, wherein:

the diffusion region is a first diffusion region;

the integrated circuit structure further comprises (i) a second diffusion region doped with the second type of dopant, the second diffusion region is above and at least in part extends within the third portion of the sub-fin, and (ii) a trench comprising dielectric material;

the second diffusion region is laterally between the first diffusion region and the trench; and the trench at least in part extends within the sub-fin.

9. The integrated circuit structure of claim 8, wherein the trench is above the PN junction between the second and third portions.

10. The integrated circuit structure of claim 8, wherein the trench is a first trench, and wherein the integrated circuit structure further comprises a second trench comprising dielectric material in contact with the sub-fin, wherein the second trench is above the second conductive contact.

11. The integrated circuit structure of claim 1, wherein:

the diffusion region is a first diffusion region;

the integrated circuit structure further comprises (i) a second diffusion region doped with the second type of dopant, the second diffusion region in contact with the sub-fin and extending upward from the sub-fin, (ii) one or more bodies of semiconductor material extending from the first diffusion region to the second diffusion region, and (iii) a gate structure comprising a gate electrode and gate dielectric on the one or more bodies.

12. The integrated circuit structure of claim 1, wherein the one or more bodies comprise one or more nanoribbons, one or more nanosheets, one or more nanowires, or a fin.

13. The integrated circuit structure of claim 1, wherein the first conductive contact is one of an anode contact or a cathode contact of a diode, and the second conductive contact is the other of the anode contact or the cathode contact of the diode.

14. The integrated circuit structure of claim 1, wherein the diffusion region is at least a part of one of an anode or a cathode of a diode, and the first portion of the sub-fin is at least a part of the other of the anode or the cathode of the diode.

15. A diode structure comprising:

a sub-fin comprising a first portion that is doped with a first type of dopant, and a second portion that is doped with a second type of dopant, wherein the first type of dopant is one of a p-type or an n-type dopant, and wherein the second type of dopant is the other of the p-type or the n-type dopant;

a first conductive contact in contact with the sub-fin, wherein the first conductive contact is one of an anode contact or a cathode contact of the diode structure;

a diffusion region doped with the second type of dopant and in contact with the sub-fin; and a second conductive contact in contact with the diffusion region, wherein the second conductive contact is the other of the anode contact or the cathode contact of the diode structure.

16. The diode structure of claim 15, wherein:

the first portion and the second portion of the sub-fin are in contact with each other, to form a PN junction.

17. The diode structure of claim 15, wherein:

the sub-fin further comprises a third portion that is doped with the first type of dopant, such that a doping concentration of the first type of dopant within the third portion is at least twice a doping concentration of the first type of dopant within the first portion; and the third portion is in contact with the second conductive contact.

18. An integrated circuit structure comprising:

a sub-fin having a first portion and second portion, the first portion being doped differently from the second portion;

a first diffusion region and a second diffusion region, each in contact with, and extending upward from, the first portion of the sub-fin;

one or more bodies of semiconductor material extending laterally from the first diffusion region to the second diffusion region;

a gate structure comprising a gate electrode and gate dielectric on the one or more bodies; and a first conductive contact comprising metal in contact with the first diffusion region, a second conductive contact comprising metal in contact with the second diffusion region, and a third conductive contact comprising metal in contact with the sub-fin and beneath both the first portion and the second portion of the sub-fin.

19. The integrated circuit structure of claim 18, wherein the one or more bodies of semiconductor material comprise one or more nanoribbons, one or more nanosheets, one or more nanowires, or a fin.

20. The integrated circuit structure of claim 18, wherein the first and second conductive contacts collectively form one of an anode contact or a cathode contact of a diode, and the third conductive contact forms the other of the anode contact or the cathode contact of the diode.

21. The integrated circuit structure of claim 18, wherein the first conductive contact and the second conductive contact are coupled to a same terminal.

22. The integrated circuit structure of claim 18, wherein the first portion and the second portion of the sub-fin are in contact with each other, to form a PN junction.

* * * * *